United States Patent [19]

Terada et al.

[11] Patent Number: 5,561,628
[45] Date of Patent: Oct. 1, 1996

[54] IC CARD AND A METHOD FOR PARALLEL PROCESSING FLASH MEMORIES

[75] Inventors: Keiji Terada, Tenri; Hidetake Tanaka, Gose, both of Japan

[73] Assignee: Sharp Kabushiki, Osaka, Japan

[21] Appl. No.: 471,208

[22] Filed: Jun. 6, 1995

[30] Foreign Application Priority Data

Dec. 19, 1994 [JP] Japan .................................. 6-315350

[51] Int. Cl.$^6$ ........................... G11C 11/34; G11C 29/00; H03M 13/00
[52] U.S. Cl. ................................ 365/185.04; 365/185.33; 365/201; 371/37.1; 371/40.4
[58] Field of Search ...................... 365/185.04, 185.09, 365/185.11, 185.29, 185.33, 189.04, 201, 218; 371/3, 37.1, 40.1, 40.4

[56] References Cited

U.S. PATENT DOCUMENTS 4,924,465  5/1990  Matsubara et al. ..................... 371/3
4,930,129  5/1990  Takahira ............................ 371/37.1

FOREIGN PATENT DOCUMENTS 2-148500  6/1990  Japan .

Primary Examiner—David C. Nelms
Assistant Examiner—Trong Phan
Attorney, Agent, or Firm—Morrison & Foerster LLP

[57] ABSTRACT

An IC card according to the present invention includes a plurality of flash memories sharing data buses and address buses corresponding to addresses except for a decode address, and a card interface for receiving an external address signal, an external data signal, and an external control signal and for controlling access to and from the external signals. The card interface includes a test circuit for applying a signal potential to a plurality of control signal output terminals for placing the plurality of flash memories in a write enabled state, the signal potential being applied by using an active signal, and the IC card also includes a signal input pad for inputting the active signal to the test circuit.

15 Claims, 24 Drawing Sheets 8 bit command / data by byte access
16 bit command / data by word access 8 bit command / data by byte access
16 bit command / data by word access

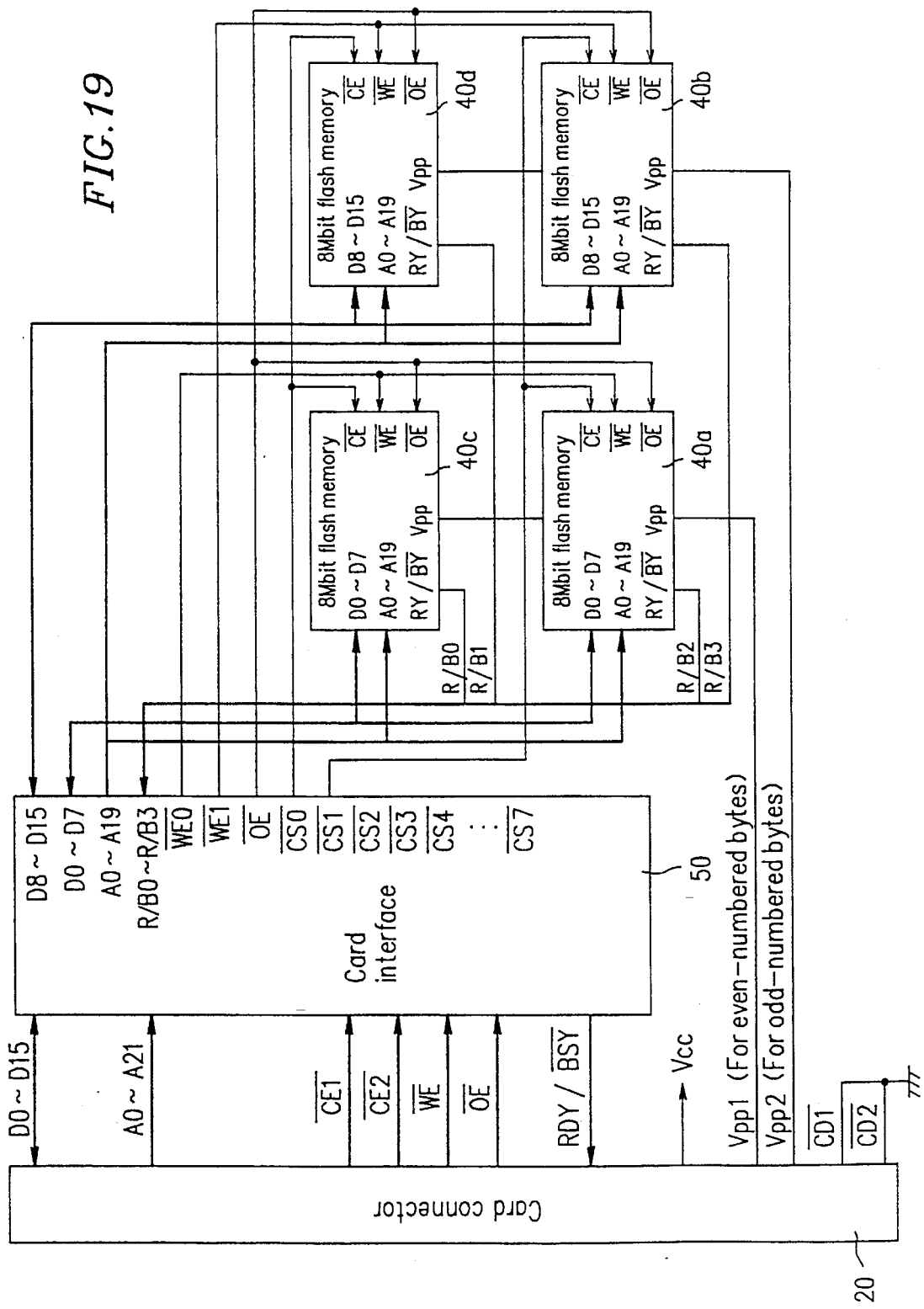

8 bit command / data by byte access
(16 bit command / data by word access)

8 bit command / data by byte access
(16 bit command / data by word access)

IC CARD AND A METHOD FOR PARALLEL PROCESSING FLASH MEMORIES

BACKGROUND OF THE INVENTION

1. Field of the Invention

The present invention relates to an IC (Integrated Circuit) card and a method for parallel processing flash memories. In particular, the present invention relates to a method for performing parallel writing and parallel erasing for a plurality of flash memories incorporated in an IC card, and the configuration of such an IC card.

2. Description of the Related Art

In recent years, it has become popular to access information by utilizing IC cards. Access to the information in an IC card by a personal computer can be made by, as shown in FIG. 17 for example, attaching the IC card 10 to a main body 2 of a personal computer 1, and operating a keyboard 3 connected the main body 2 via a cable 4. Thus, the information stored in the IC card 10 can be accessed (read/written) by the computer 1, and results of operations made by the computer 1 can be stored in the IC card 10.

FIG. 18A shows the structure of a portion of the computer main body 2 at which the IC card 10 is connected. FIG. 18B shows the internal structure of the IC card 10. As shown in FIG. 18A, a card socket 5 installed inside the computer main body 2 interconnects an operation device (not shown) of the computer 1 to the IC card 10. The card socket 5 has a structure capable of holding the IC card 10 in place. Connection pins 5a, which are connected to the operation device via wires 5b, are provided in a portion of the card socket 5. When the IC card 10 is inserted in the card socket 5, the connection pins 5a are electrically connected to connection terminals 21 of a connector portion 20 of the IC card 10.

The IC card 10 includes, for example, a signal processing device and/or a storage device provided on a card substrate 30 such as a printed circuit board. To one end of the card substrate 30 of the IC card 10, the connector portion 20 is attached. Thereafter, the entire card substrate 30 is sealed with a packaging member 10a such as a resin film. As a signal processing device, a card interface 50 is mounted on the card substrate 30. The card interface 50 processes a plurality of input signals and output signals. As storage devices, a plurality of flash memories 40a to 40d are mounted on the card substrate 30. On one end of the card substrate 30, a plurality of connection terminals 31, which are connected to the respective connection terminals 21 of the connector portion 20, are provided so as to be aligned along the end.

FIG. 19 is a diagram showing the flow of signals between the card connector 20, the card interface 50, and the flash memories 40a to 40d. FIG. 20 is a diagram showing the internal configuration of the card interface 50.

As best seen in FIG. 20, the card interface 50 is coupled to the card connector 20 via an input/output buffer 51, and to the flash memories 40a to 40d via an input/output buffer 55 in the card interface 50. In other words, access to data signals D0 to D15 between the card interface 50 and the card connector 20 is made via the input/output buffer 51; access to data signals D0 to D7 between the card interface 50 and the flash memories 40a and 40c is made via the input/output buffer 55; and access to data signals D8 to D15 between the card interface 50 and the flash memories 40b and 40d is made via the input/output buffer 55. The card interface 50 includes a data control 54 for varying a bus width, which is the reason why a 16-bit data bus is employed between the input/output buffer 51 and the data control 54, and two 8-bit data buses are employed between the input/output buffer 55 and the data control 54. The data bus for transmitting the data signals D0 to D7 is shared by the flash memories 40a and 40c. The data bus for transmitting the data signals D8 to D15 is shared by the flash memories 40b and 40d.

In the descriptions of various signals in the rest of the present specification, the symbol "/" is conveniently used to express "‾" (bar). For example, "/AB" represents "$\overline{AB}$", and "AB//CD" represents "AB/$\overline{CD}$", while "AB/CD" should simply be interpreted as "AB/CD".

The card interface 50 further includes an input buffer 52 for receiving address signals A0 to A21, chip enable signals /CE1 and /CE2, a write enable signal /WE, and an output enable signal /OE. All the address signals A0 to A21 except for the most significant decode address signals A20 and A21, i.e., the address signals A0 to A19, are supplied to the flash memories 40a to 40d via the output buffer 56a. Furthermore, the card interface 50 includes a controller 53 for controlling the flash memories 40a to 40d and the data bus control 54 based on the chip enable signals /CE1 and /CE2, the write enable signal /WE, the output enable signal /OE, and the most significant decode address signals A20 and A21.

The controller 53 selects one of the flash memories 40a to 40d in accordance with chip select signals /CS0 and /CS1, which are based on the most significant decode address signals A20 and A21. The controller 53 generates write enable signals /WE0 and /WE1 based on the chip enable signals /CE1 and /CE2 and the write enable signal /WE, and selects the one of the flash memories 40a to 40d in which information is to be written, based on the generated write enable signals /WE0 and WE1. Thus, the controller 53 functions to supply the output enable signal /OE from the input buffer 52 to the flash memories 40a to 40d. Since the IC card 10 of this example has only four flash memories 40a to 40d, it is not necessary to employ chip select signals /CS2 to /CS7.

The card interface 50 includes an input buffer 58 for receiving ready busy signals R/B0 to R/B3 from the flash memories 40a to 40d, a signal processing circuit 59, and an output buffer 57. The signal processing circuit 59 outputs a ready busy signal RDY//BSY which is at an L (low) level when one of the ready busy signals R/B0 to R/B3 is at the L level, and subjects the output from the input buffer 58 to a signal process. The output buffer 57 outputs the ready busy signal RDY//BSY to the card connector 20.

Furthermore, the card socket 5 supplies a voltage Vcc for driving the flash memories 40a to 40d and supply voltages Vpp1 and Vpp2 for writing operations and erasing operations to the IC card 10. The supply voltage Vpp1 is coupled to the flash memories 40a and 40c in the first row, which is for even-numbered bytes. The supply voltage Vpp2 is coupled to the flash memories 40b and 40d in the second row, which is for odd-numbered bytes. Signals /CD1 and /CD2, which are supplied to the card connector 20 as ground voltages, are employed for determining whether the IC card 10 is properly connected to the card socket 5. When the connection between the IC card 10 and the card socket 5 is incomplete, the computer 1 terminates any processing for the IC card 10.

In the IC card 10 of the above-described configuration, the data bus and the address buses, except for those which correspond to the most significant decode address signals A20 and A21, are shared by a plurality of flash memories. A reading operation, a writing operation, or an erasing operation is performed by accessing one of the flash memories based on the most significant decode address signals A20 and A21 and the chip enable signals /CE1 and /CE2.

For example, in the case where the flash memory 40c is selected, the decode address signal A20 and A21 and the chip enable signals /CE1 and /CE2 are first varied in such a manner that the chip select signal /CS0 is at the L (low) level and that the chip select signal /CS1 is at an H (high) level. As a result, the flash memories 40c and 40d aligned in a horizontal row in FIG. 19 are selected.

When the card interface 50 outputs the write enable signal /WE0 at the L level and the write enable signal /WE1 at the H level based on the chip enable signals /CE1 and /CE2 and the write enable signal /WE, for example, the flash memories 40a and 40c aligned in a vertical row in FIG. 19 are selected. As a result, the flash memory 40c is selected.

The IC card 10 carrying the flash memories 40a to 40d mounted thereon must be subjected to a test with respect to each memory after the flash memories 40a to 40d are mounted on the card substrate 30. The reason is that, although a device test is expected to have been conducted for each flash memory before it is mounted, there is a possibility for one or more of the flash memories to have defective portions while being mounted on the card substrate 30.

Japanese Laid-Open Patent Publication No. 2-148500 describes an example of a method for performing such a device test. According to this method, when writing or erasing information in a flash memory of an IC card, a write command or an erase command, an address signal, and data are supplied from a connector of the IC card, and one of the flash memory devices is selected via a card interface, whereby access is made.

The outline of such a test method will be described below.

FIG. 21 schematically shows the configuration of an apparatus to be used for conducting a test for an IC card before being sealed with a packaging member. FIG. 22 shows the flow of a signal from a card connector 62 used in this test apparatus (hereinafter referred to as "test card connector") to the inside of the IC card.

Necessary devices such as a card interface 50 and flash memories 40a to 40d are already mounted on the card substrate 30. The test apparatus 60 includes a main body 60a for performing a signal process for test signals and a support 60b for the card substrate 30 carrying the flash memories 40a to 40d. The support 60b includes a base 61 for supporting the card substrate 30 and the test card connector 62 for applying test signals to connection terminals 31 of the IC card 10. As shown in FIG. 22, the test card connector 62 has a configuration corresponding to that of the card socket 5 incorporated in office automation equipment, e.g., personal computers.

FIG. 23 shows the flow of a writing test. FIG. 24 shows the flow of an erasing test. Two methods are applicable to these tests: a byte (8 bit) access method and a word (16 bit) access method. Under the byte (8 bit) access method, access is made to every device (flash memory) in a serial manner, and the test is repeated as many times as the number of devices. Under the word (16 bit) access method, access is made to every pair of devices (two flash memories), and the test is repeated as many times as the number of pairs of devices. The flows shown in FIGS. 23 and 24 correspond to the byte access method.

Hereinafter, the writing test will be described.

At step Sr1, the first test device is selected based on the most significant decode address signals A20 and A21 and the chip enable signals /CE1 and /CE2. For example, the flash memory 40c may be selected. Thereafter, a write setup command is supplied to the flash memory 40c. As a result, the flash memory 40c enters a write enabled state (step S11). Next, a write command is supplied to the flash memory 40c (step S12). Furthermore, a write address and data are supplied to the flash memory 40c, and test data is written in a predetermined address of the flash memory 40c (step S13). Thereafter, it is determined whether or not the test data is properly written in the address (step S14).

If a write error is detected, the writing test for the flash memory 40c is finished. If no write error is detected, it is determined whether or not the address for which the above-mentioned writing has been conducted is the last address (step S15). If the address is not the last address, the process goes back to step S12. When the writing judgment is complete for every address of the flash memory 40c, the writing test for the first flash memory 40c is finished. The writing judgment process (steps S11 to S15) is repeated for the other flash memories 40a, 40b, and 40d provided on the card substrate 30. In other words, steps Sr2 to Sr4 are performed, and the overall writing test for the IC card 10 is finished.

In this example, the number of flash memories mounted on the card substrate 30 is four, so the above-described writing judgment process is conducted four times. However, it will be appreciated that the writing judgment process is conducted as many steps Srn as the number n of the flash memories mounted on the card substrate 30.

Next, the erasing test will be described. The erasing test is performed in substantially the same manner as the writing test. Specifically, at step Se1, the first test device is selected, e.g., the flash memory 40c. Thereafter, an erase setup command is executed, whereby the flash memory 40c enters an erasable state (step S21). Next, a block of the flash memory 40c that is to be erased is designated (step S22). Then, an erase command is executed so as to erase information stored in the addresses of the designated block (step S23). Thereafter, it is determined whether or not the data in the addresses of the designated block is properly erased (step S24). If an erase error is detected, the erasing test for the flash memory 40c is finished. If no erase error is detected, it is determined whether or not the block for which the above-mentioned erasing has been conducted is the last block (step S25). If the block is not the last block, the process goes back to step S22. When the erasing judgment is complete for every block, the erasing test for the first flash memory 40c is finished. The erasing judgment process (steps S21 to S25) is repeated for the other flash memories 40a, 40b, and 40d provided on the card substrate 30. In other words, steps Sr2 to Sr4 are performed, and the overall erasing test for the IC card 10 is finished.

Although a writing test and an erasing test by the byte access method were described, where the flash memories 40a to 40d were individually tested, access to the flash memories 40a to 40d may be made by the word access method, where each process in the writing test (steps S11 to S15) and each process in the erasing test (steps S21 to S25) can be performed for every two flash memories. By thus adopting the word access method for the writing test and erasing test, each process need only be repeated half the number of times as the number of flash memories mounted on the card substrate 30.

The time required to perform a writing process or an erase process for all the flash memories in the IC card 10 by the byte access method is: (the time required for writing or erasing information in one flash memory)×(the number of device). By the word access, it is: (the time required for writing or erasing information in one pair of flash memories)×(the number of pairs of devices).

Currently, an 8M-bit IC card manufactured by Sharp Kabushiki Kaisha., i.e., an IC card in which 8M-bit flash memories are mounted, takes one second or less to read all the addresses of one flash memory, 9.6 seconds to write in all the addresses of one flash memory, and 25.6 seconds to erase from all the addresses of one flash memory. These time values are taken under a standard operation.

Accordingly, a 4M-byte IC card, i.e., an IC card in which four 8M-bit flash memories are mounted, takes 38.4 seconds (=9.6×4) to write, and 102.4 seconds (=25.6×4) to erase, by the byte access method. The 32-byte IC card takes 19.2 seconds (=9.6×2) to write, and 51.2 seconds (=25.6×2) to erase, by the word access method.

The number of devices, i.e., flash memories, to be mounted in an IC card is expected to increase as the high-density mounting technique for IC cards improves. The time required for the writing processes and the erasing processes in the conventional test methods drastically increases in proportion with the number of devices, thereby greatly increasing the cost of examination for the IC card. It is difficult to realize parallel writing or parallel erasing by using a testing program, too.

SUMMARY OF THE INVENTION

An IC card according to the present invention includes a plurality of flash memories sharing data buses and address buses corresponding to addresses except for a decode address, and a card interface for receiving an external address signal, an external data signal, and an external control signal and for controlling access to and from the external signals, wherein the card interface includes a test circuit for applying a signal potential to a plurality of control signal output terminals for placing the plurality of flash memories in a write enabled state, the signal potential being applied by using an active signal, and wherein the IC card further includes a signal input pad for inputting the active signal to the test circuit.

According to the present invention, a method is provided for parallel processing a plurality of flash memories included by an IC card including a card interface for receiving an external address signal, an external data signal, and an external control signal and for controlling access to and from the external signals, the plurality of flash memories sharing data buses and address buses corresponding to addresses except for a decode address, wherein the card interface includes a test circuit for applying a signal potential to a plurality of control signal output terminals for placing the plurality of flash memories in a write enabled state, the signal potential being applied by using an active signal, and the IC card further includes a signal input pad for inputting the active signal to the test circuit, and wherein the method includes the steps of: attaching the IC card to a card connector; applying the active signal to the signal input pad so as to place all of the plurality of flash memories in the write enabled state, and thereafter executing a write command or an erase command so as to supply a test signal to the plurality of flash memories via the card interface, thereby performing a parallel writing process or a parallel erasing process for all of the plurality of flash memories.

Alternatively, the IC card according to the present invention includes a plurality of flash memories sharing data buses and address buses corresponding to addresses except for a decode address, and a card interface for receiving an external address signal, an external data signal, and an external control signal and for controlling access to and from the external signals, wherein the card interface includes a test circuit for placing in a high-impedance state a plurality of control signal output terminals for placing the plurality of flash memories, the test circuit being placed in the high-impedance state by an active signal, and wherein the IC card further includes a signal input pad for inputting the active signal to the test circuit and control signal input pads connected to the plurality of control signal output terminals.

Alternatively, according to the present invention, a method is provided for parallel processing a plurality of flash memories included in an IC card which also includes a card interface for receiving an external address signal, an external data signal, and an external control signal and for controlling access to and from the external signals, the plurality of flash memories sharing data buses and address buses corresponding to addresses except for a decode address, wherein the card interface includes a test circuit for placing in a high-impedance state a plurality of control signal output terminals for placing the plurality of flash memories, the test circuit being placed in the high-impedance state by an active signal, and the IC card further includes a signal input pad for inputting the active signal to the test circuit and control signal input pads connected to the plurality of control signal output terminals, and wherein the method includes the steps of: attaching the IC card to a card connector; applying the external control signal to at least one of the control signal input pads while applying the active signal to the signal input pad so as to place those of the plurality of flash memories which correspond to the at least one control signal input pad in a write enabled state, and thereafter executing a write command or an erase command so as to supply a test signal to the plurality of flash memories via the card interface, thereby performing a parallel writing process or a parallel erasing process for the flash memories which correspond to the at least one control signal input pad.

Alternatively, the IC card according to the present invention includes: a plurality of flash memories for storing data; and a card interface for receiving a control signal and an address signal which includes a first portion and a second portion and for supplying a write signal or an erase signal to the plurality of flash memories in accordance with the first portion of the address signal and the control signal, wherein the plurality of flash memories share a data bus for transmitting the data and an address bus for transmitting the second portion of the address signal; the IC card further includes a test circuit and a test terminal; and the test circuit sets a plurality of terminals of the card interface for outputting the write signal or the erase signal in a first state when the test terminal receives an active signal.

In one embodiment of the invention, the first state is a high-impedance state.

In another embodiment of the invention, the first state is a low-level state.

In still another embodiment of the invention, the second portion of the address signal represents an address of at least two of the plurality of flash memories.

In still another embodiment of the invention, the IC card further includes a plurality of control signal input pads for receiving a write enable signal.

In still another embodiment of the invention, the plurality of control signal input pads are respectively connected to the plurality of terminals of the card interface.

Alternatively, according to the present invention, a method is provided for parallel processing a plurality of flash memories for storing data, the plurality of flash memories included in an IC card, where the IC card further includes a card interface for receiving a control signal and an address signal which includes a first portion and a second portion and for supplying a write signal or an erase signal to the plurality of flash memories in accordance with the first portion of the address signal and the control signal, wherein the plurality of flash memories share a data bus for transmitting the data and an address bus for transmitting the second portion of the address signal, and the IC card further includes a test circuit and a test terminal, and wherein the method includes the steps of: supplying the active signal to the test terminal so as to place a plurality of output terminals for outputting the write signal or the erase signal in a first state; supplying a write setup command signal or an erase setup command signal to the plurality of flash memories via the card interface; and performing a parallel write process or a parallel erase process for the plurality of flash memories.

In one embodiment of the invention, the first state is a low level state.

In another embodiment of the invention, the parallel write process transmits data to be written in the plurality of flash memories and address information to be written in the plurality of flash memories, and the parallel erase process transmits an address of the plurality of flash memories to be erased.

Alternatively, according to the present invention, a method is provided for parallel processing a plurality of flash memories for storing data, the plurality of flash memories included in an IC card, and the IC card further including a card interface for receiving a control signal and an address signal which includes a first portion and a second portion and for supplying a write signal or an erase signal to the plurality of flash memories in accordance with the first portion of the address signal and the control signal, wherein the plurality of flash memories share a data bus for transmitting the data and an address bus for transmitting the second portion of the address signal, and the IC card further includes a test circuit, an input pad for receiving an active signal, and a control signal input pad connected to a plurality of terminals for outputting the write signal and the erase signal, and wherein the method includes the steps of: supplying the active signal to the test terminal so as to place a plurality of output terminals for outputting the write signal or the erase signal in a high-impedance state; supplying a second control signal to the control signal input pad so as to place at least one pair of the plurality of flash memories into a write enable state; supplying a write setup command signal or an erase setup command signal to the at least one pair of the plurality of flash memories via the card interface; and performing a parallel write process or a parallel erase process for the at least one pair of the plurality of flash memories.

In one embodiment of the invention, the parallel write process transmits data to be written in at least one pair of the plurality of flash memories and address information to be written in the at least one pair of the plurality of flash memories, and the parallel erase process transmits an address of the at least one pair of the plurality of flash memories to be erased.

In accordance with an IC card of the present invention, a card interface for controlling access to and from external signals includes a test circuit for applying signal voltages to a plurality of control signal output terminals such that at least two of the plurality of flash memories are placed in a write enabled state when an active signal is applied to the at least two flash memories, and the IC card includes a signal input pad for inputting the active signal to the test circuit. By applying the active signal to the signal input pad from outside the IC card, the flash memories enter a write enabled state. Therefore, by executing a write command or erase command once for the flash memories in the write enabled state, the at least two flash memories can be parallel written or parallel erased.

As a result, according to the present invention, the time required for a writing test or an erasing test for a plurality of flash memories mounted on a substrate of an IC card can be reduced. Thus, the production test process for IC cards is effectively prevented from increasing as the high-density mounting technique for IC cards improves.

According to the present invention, only one signal input pad is required to be provided in the IC card, so that the various devices on the card substrate are hardly subject to any positional restraints.

Furthermore, in accordance with an IC card of the present invention, a card interface for controlling access to and from external signals includes a test circuit for applying signal voltages to a plurality of control signal output terminals for placing the flash memories in a write enabled state, the output terminals being placed in a high-impedance state by an active signal, and the IC card includes a signal input pad for inputting the active signal to the test circuit and a control signal input pad connected to at least one of the control signal output terminals. By applying the active signal to the signal input pad from outside the IC card, the control signal output terminals enter a high-impedance state. Thus, the function of placing the flash memories into a write enabled state can be separated from the card interface.

As a result, by applying at least one appropriate signal to at least two of the plurality of control signal output terminals which are placed in a high-impedance state, a number of flash memories can be arbitrarily placed in a write enabled state regardless of the signals from a card connector. Accordingly, by executing a write command or erase command once for the flash memories in the write enabled state, the flash memories can be parallel written or parallel erased.

As a result, according to the present invention, the time required for a writing test or an erasing test for a plurality of flash memories mounted on a substrate of an IC card can be reduced. Thus, the production test process for IC cards is effectively prevented from increasing as the high-density mounting technique for IC cards improves.

The number of flash memories to be parallel written or erased can be adjusted by the signals to be input to the control signal output terminals. Therefore, a large amount of freedom is provided in the process of parallel writing and parallel erasing for flash memories.

Thus, the invention described herein makes possible the advantages of (1) providing an IC card which requires less time for performing writing operations and erasing operations for a plurality of flash memories mounted on a card substrate of the IC card, and therefore reduces the time needed to perform the production test process for the IC card as the high-density mounting technique for IC cards improves; and (2) providing a method for performing parallel processes for flash memories.

These and other advantages of the present invention will become apparent to those skilled in the art upon reading and understanding the following detailed description with reference to the accompanying figures.

BRIEF DESCRIPTION OF THE DRAWINGS

FIG. 18A shows a configuration for a card socket incorporated in a computer; and FIG. 18B shows a connector portion of the IC card and the arrangement of devices on a card substrate thereof.

FIG. 19 is a view showing a flow of signals between a card connector 20 of a conventional IC card and a card interface and flash memories incorporated in the IC card.

DESCRIPTION OF THE PREFERRED EMBODIMENTS

EXAMPLE 1

Figure 1:
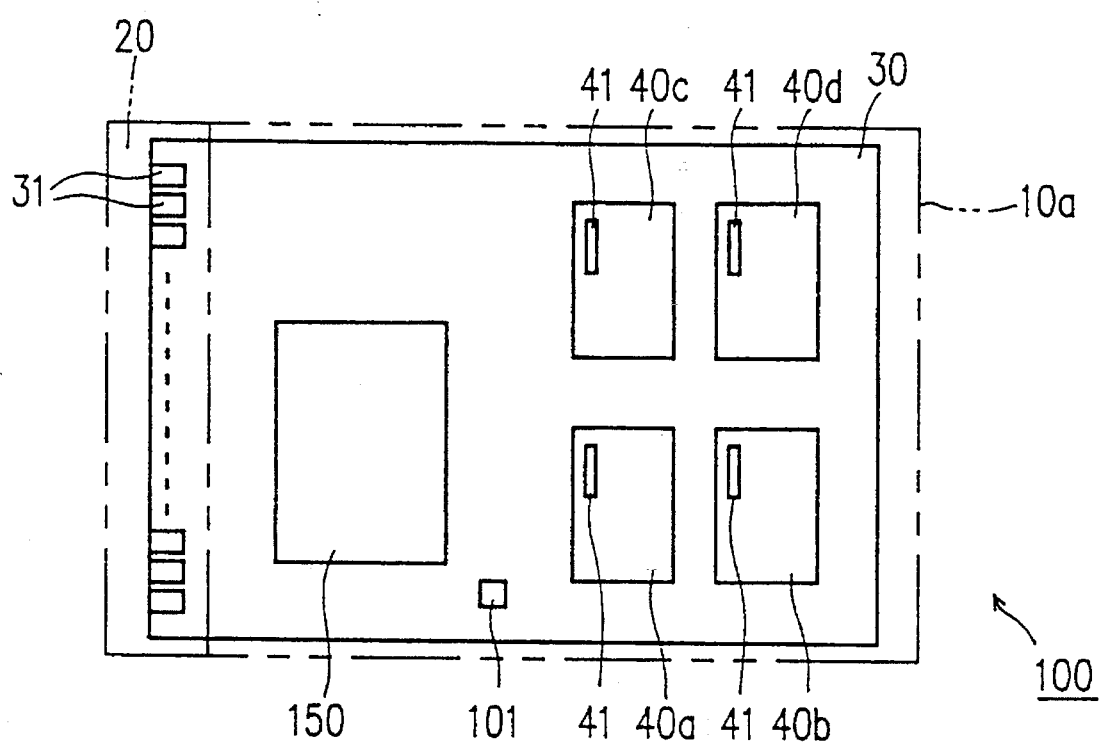
FIG. 1 is a plan view showing a configuration for a PC flash card as an IC card according to a first example of the present invention.
Figure 18A:
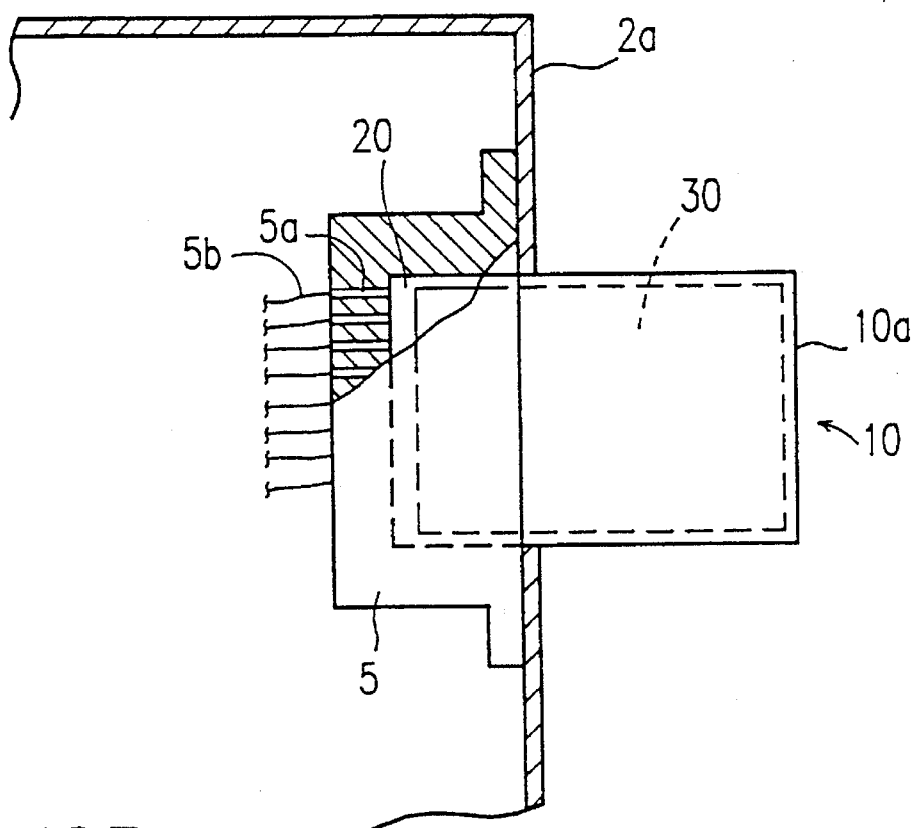
FIGS. 18A and 18B are views showing a structure of a portion of the computer shown in FIG. 17 that is connected to an IC card and the internal structure of the IC card.
Figure 18B:
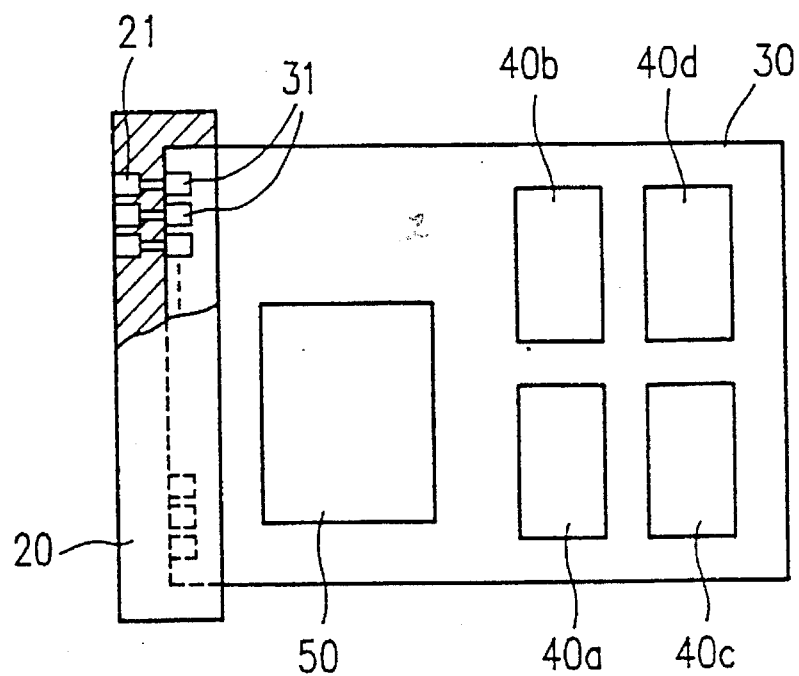
Figure 20:
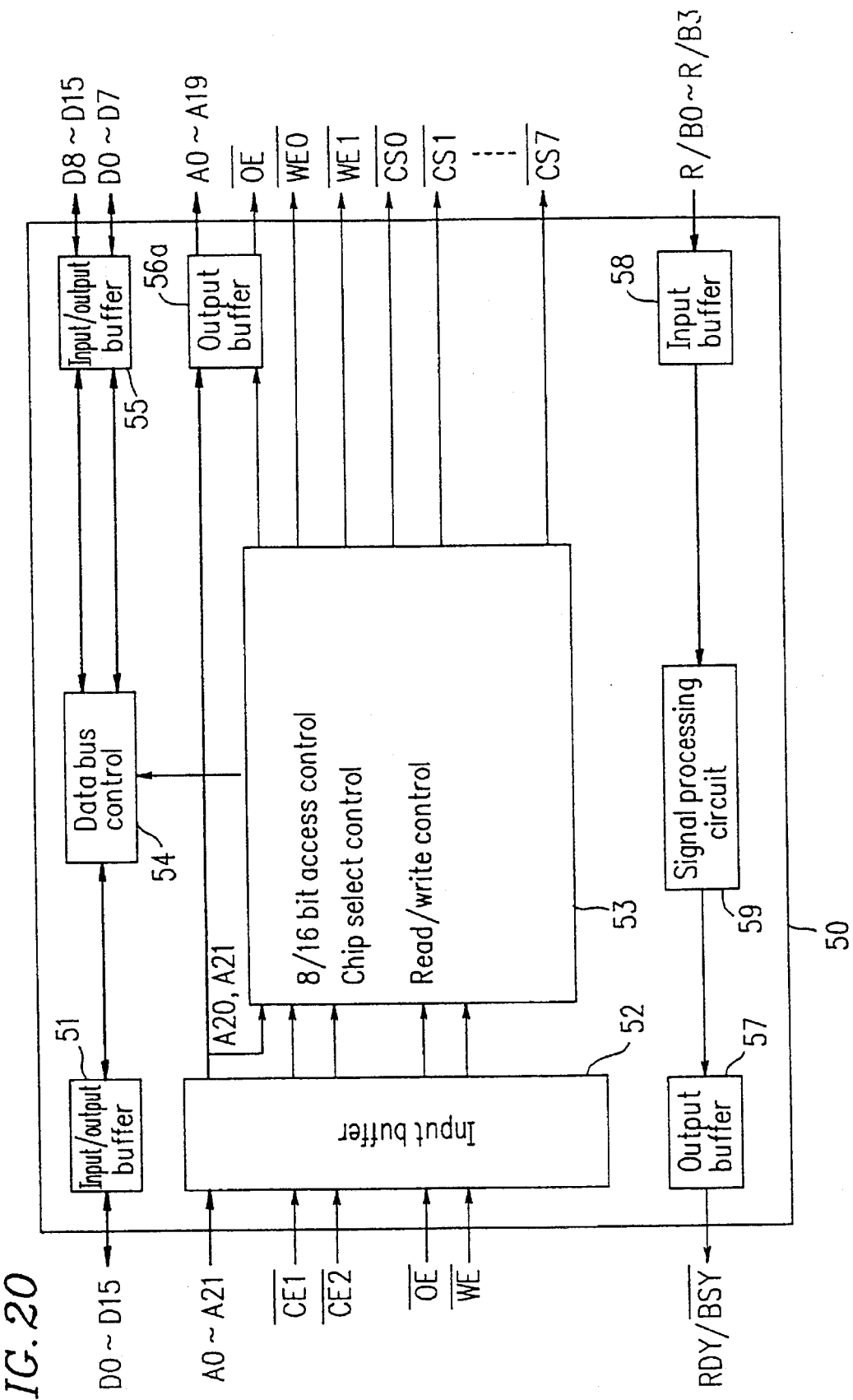
FIG. 20 is a block diagram showing a configuration for a card interface included in a conventional IC card.
Figure 21:
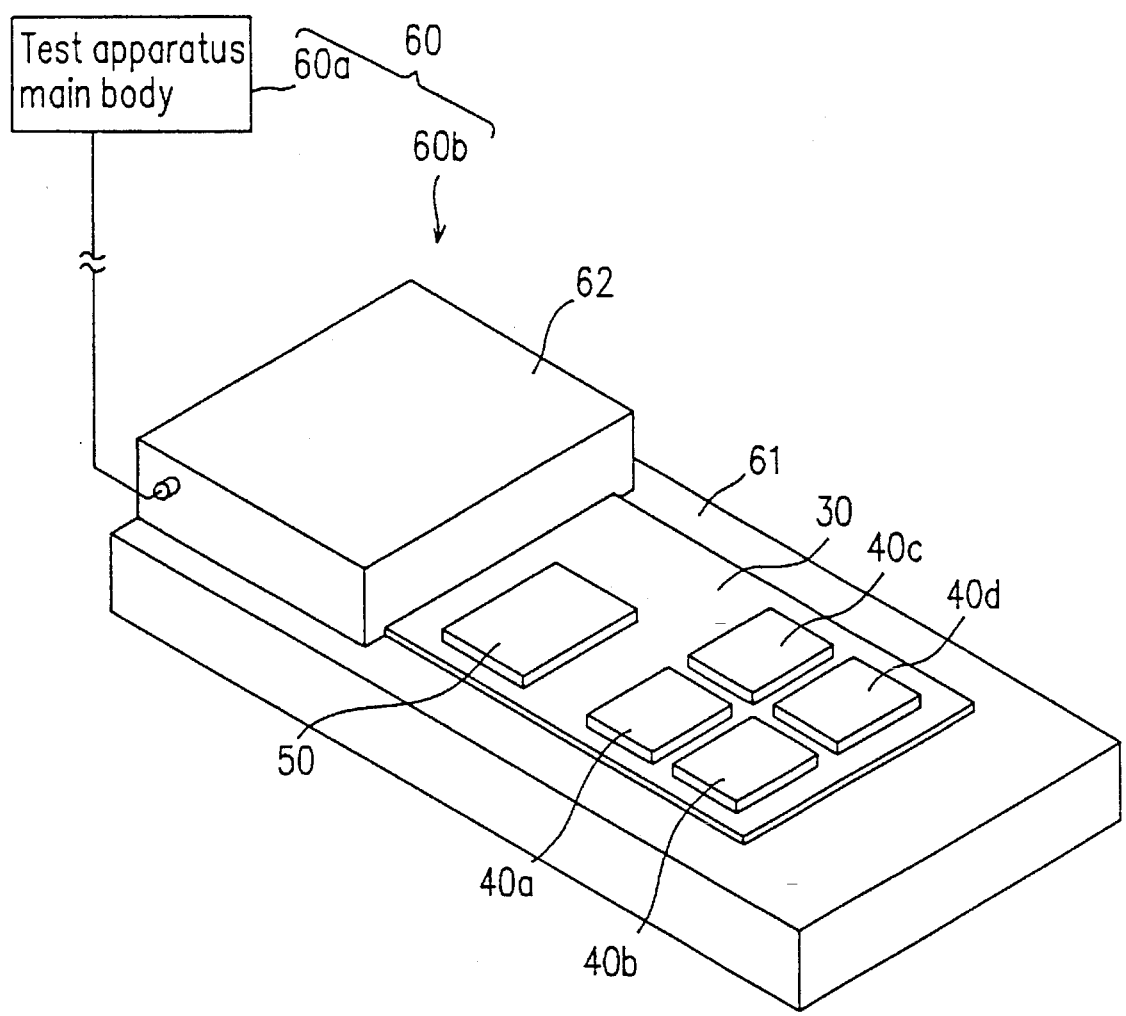
FIG. 21 is a schematic view showing a configuration for an apparatus for performing a writing test and an erasing test for flash memories incorporated in a conventional IC card before the packaging of the IC card.
Figure 22:
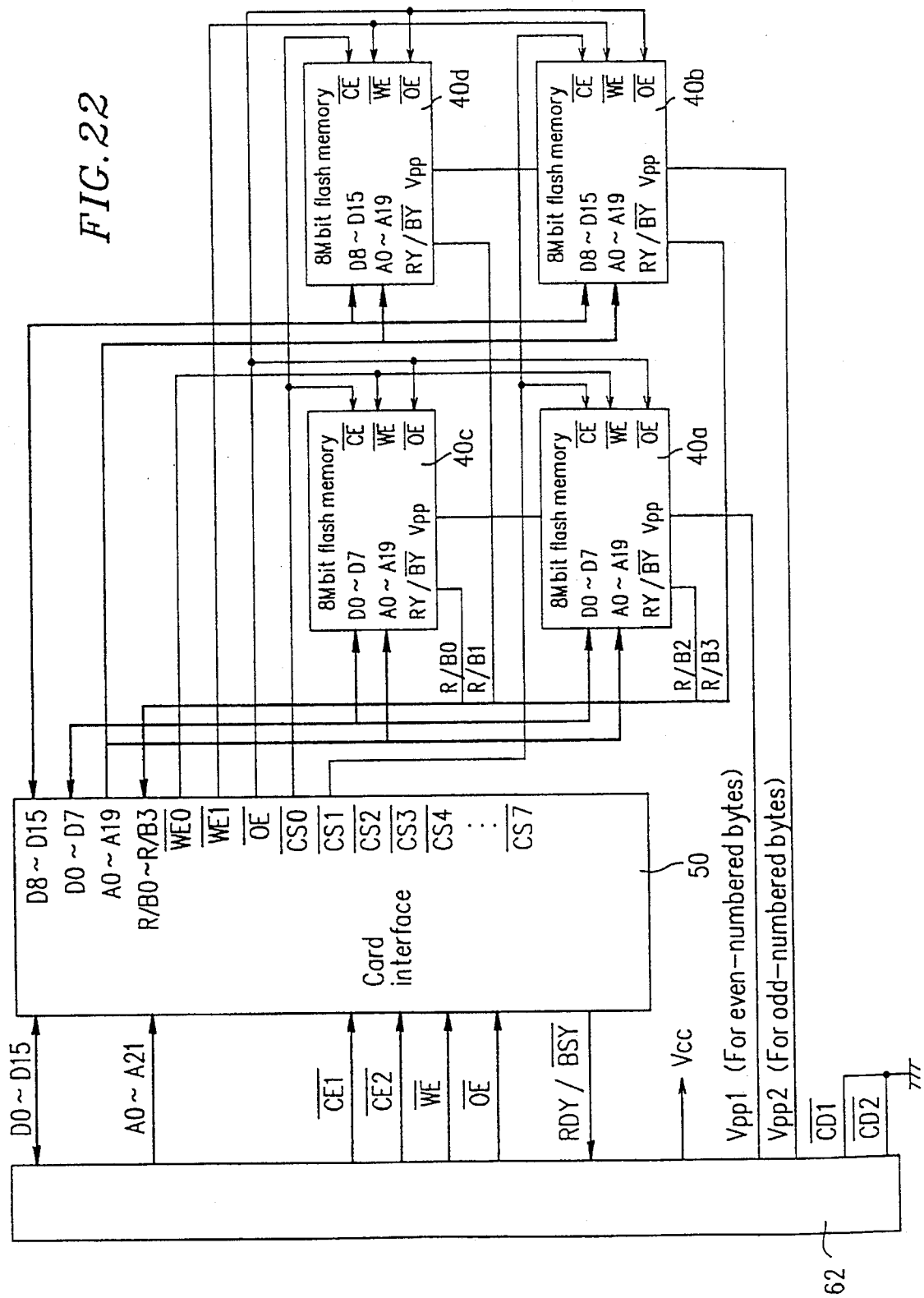
FIG. 22 is a view showing a flow of signals between a card connector of a test apparatus and a card interface and flash memories incorporated in a conventional IC card.
Figure 23:
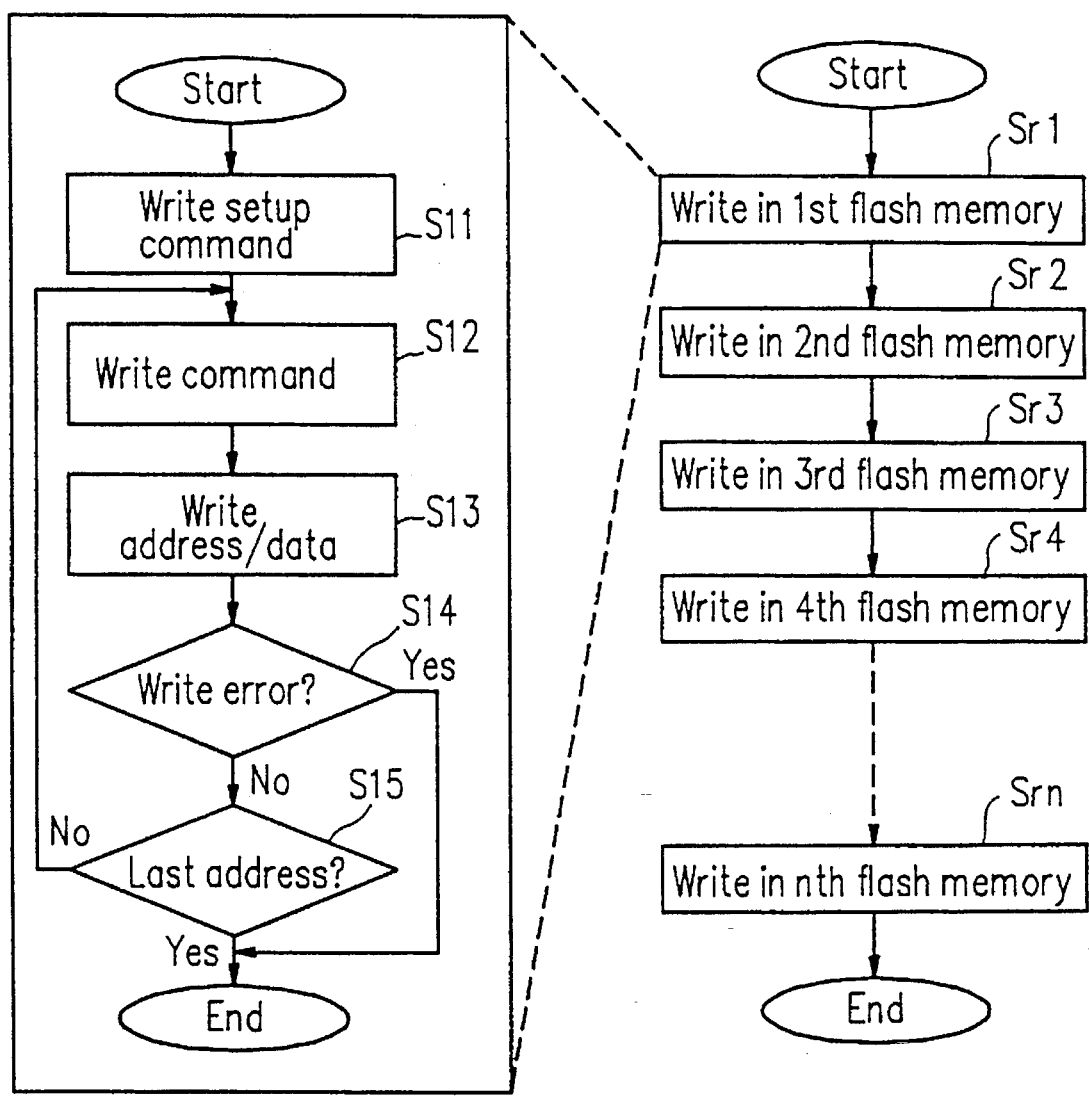
FIG. 23 is a flow diagram showing the steps performed in a writing test for a conventional IC card.
Figure 24:
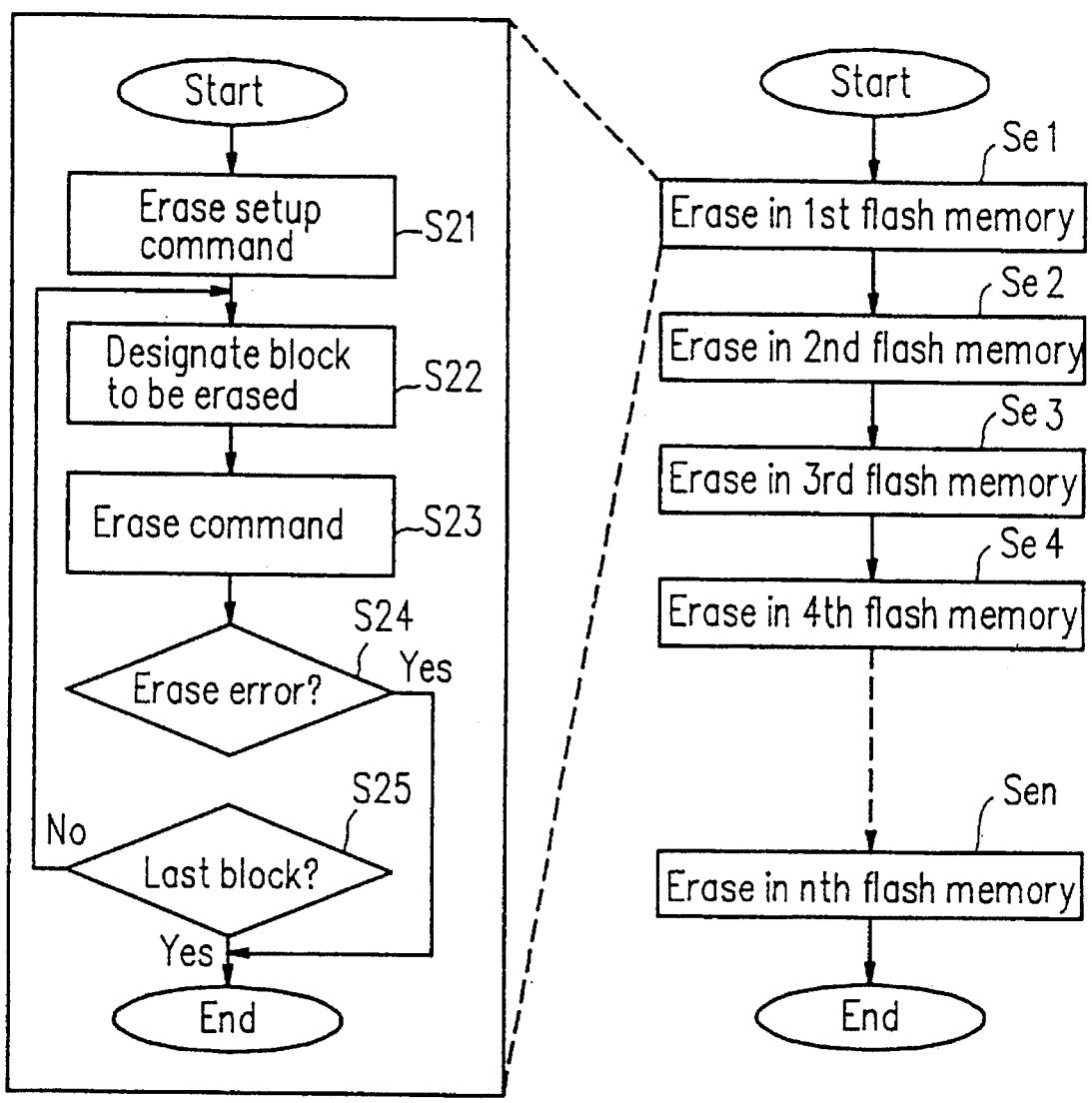
FIG. 24 is a flow diagram showing the steps performed in an erasing test for a conventional IC card.

FIG. 1 is a plan view showing a configuration for an IC card 100 according to Example 1 of the present invention. Constituent elements which also appear in FIG. 18B (showing the conventional IC card 10) are indicated by the same reference numerals as used therein.

The IC card 100 is a memory card or an I/O card pursuant to the JEIDA (Japan Electronics Industry Development Association) standard and PCMCIA (Personal Computer Memory Card International Association) standard, and is often referred to as a "PC card".

The IC card (hereinafter also referred to as the "PC card") 100 includes, as in the case of the conventional IC card 10, signal processing devices and/or storage devices mounted on a card substrate 30 such as a printed circuit board, and a card connector portion 20 attached on one end of the card substrate 30. The entire card substrate 30 is sealed with a packaging member 10a such as a resin film. As a signal processing device, a card interface 150 for processing a plurality of input signals and output signals is mounted on the card substrate 30. As storage devices, a plurality of flash memories 40a to 40d are mounted on the card substrate 30. Each of the flash memories 40a to 40d includes a status register 41 in which values of registers SR.0 to SR.7, corresponding to bit 0 to bit 7, vary depending on the operation state of the memory. The data stored in the status register 41 can be read to the outside of the PC card 100 via a data bus for transmitting data signals D0 to D15.

The arrangement of the registers SR.0 to SR.7 of the status register 41 is described in Table 1 below. The meanings of the registers SR.0 to SR.7 are described in Table 2 below.

TABLE 1

| bit 7 | bit 6 | bit 5 | bit 4 | bit 3 | bit 2 | bit 1 | bit 0 |
| --- | --- | --- | --- | --- | --- | --- | --- |
| SR.7 WSMS | SR.6 ESS | SR.5 ES | SR.4 BWS | SR.3 VPPS | SR.2 R | SR.1 R | SR.0 R |

TABLE 2

| register | | | content |
| --- | --- | --- | --- |
| SR.7 = | Write State Machine Status | | "1" indicates a state where reading/erasing/ writing of data is possible |
| | 1 = | Ready | |
| | 0 = | Busy | |
| SR.6 = | Erase Suspend Status | | Confirms execution of an erase suspend command |
| | 1 = | Erase Suspend | |
| | 0 = | Erase In Progress/Completed | |
| SR.5 = | Erase Status | | |
| | 1 = | Error In Block Erase | Becomes "1" when an erase error occurs; |
| | 0 = | Successful Block Erase | Reset to "0" by a status register clear command |
| SR.4 = | Byte Write Status | | Becomes "1" when a write error occurs; |
| | 1 = | Error In Byte Write | |
| | 0 = | Successful Byte Write | Reset to "0" by a status register clear command |
| SR.3 = | Vpp Status | | Becomes "1" when the necessary Vpp is smaller than VppH (Vpp < VppH) during writing or erasing; Reset to "0" by a status register clear command |
| | 1 = | Vpp Low Detect; Operation Abort | |
| | 0 = | Vpp OK | |
| SR.2 – SR.0 = Reserved for future | | | |

A signal input pad 101 is provided on the card substrate 30 of the PC card 100. The signal input pad 101 is employed for inputting a predetermined signal to the card interface 150 in a writing test or an erasing test. The position of the signal input pad 101 can be anywhere on the card substrate 30. In the configuration shown in FIG. 1, the signal input pad 101 is provided in the vicinity of the card interface 150.

Figure 2:
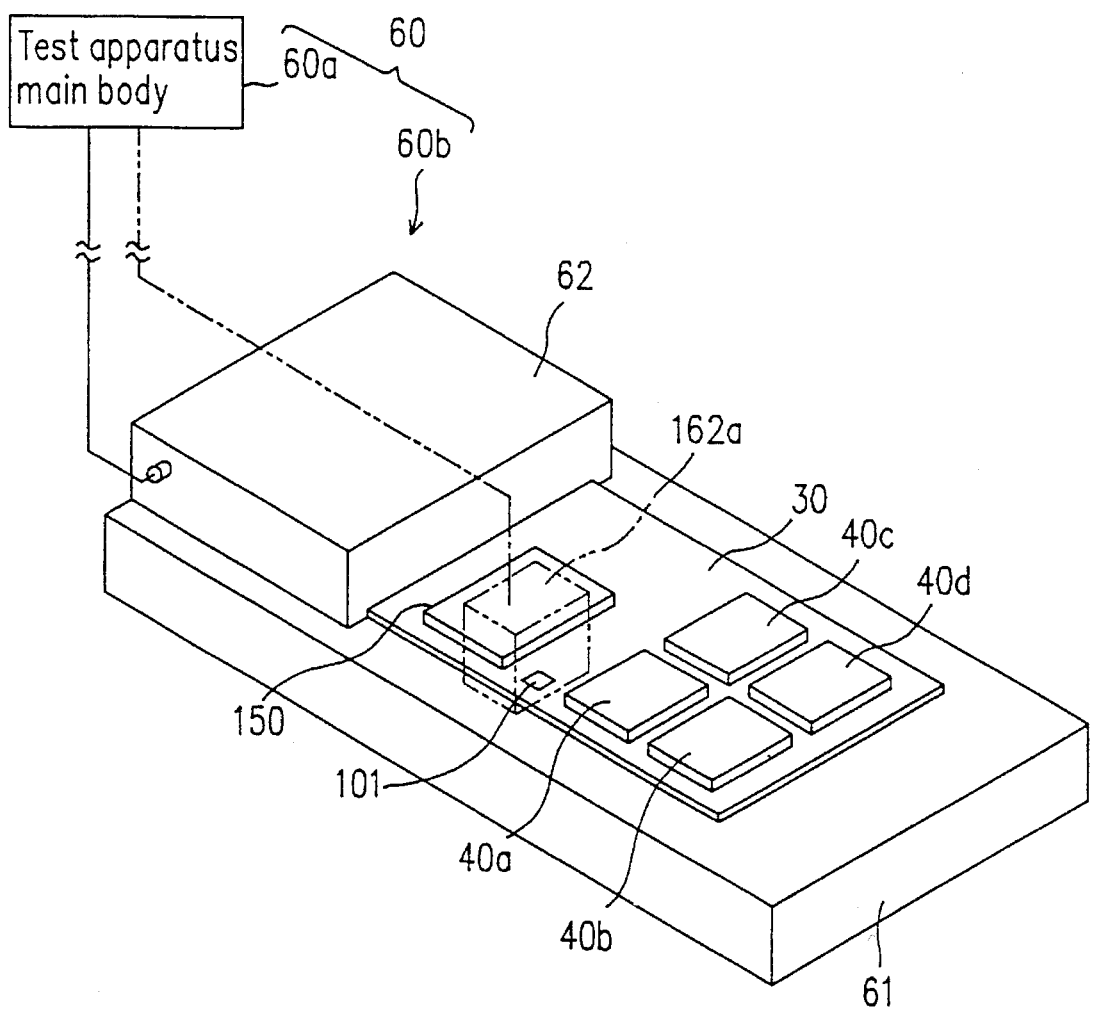
FIG. 2 is a schematic view showing a configuration for an apparatus for performing a writing test and an erasing test for flash memories incorporated in the PC card according to the first example before the packaging of the PC card.

FIG. 2 is a schematic view showing a configuration for an apparatus for performing a writing test and an erasing test before the packaging of the PC card 100.

The test apparatus 60 includes a main body 60a and a support 60b for the card substrate 30. The support 60b includes a base 61 for supporting the card substrate 30, a test card connector 62, and a probe 162a.

When the PC card 100 is connected to the test card connector 62, the probe 162a for applying a signal to the signal input pad 101 of the PC card 100 is electrically connected to the signal input pad 101. The probe 162a is coupled to the test apparatus main body 60a. The signal input pad 101 can be provided on a back face of the card substrate 30. In this case, the probe 162a for applying a signal to the signal input pad 101 is provided inside the base 61. In the case where the signal input 101 is opposite to the surface of the base 61, the surface of the base 61 can be opposite to the surface of the card interface 150 and/or the surface of the flash memories 40a to 40d.

Moreover, it is applicable to electrically connect the signal input pad 101 to the probe 162a in accordance with an instruction from the test apparatus main body 60a.

Figure 3:
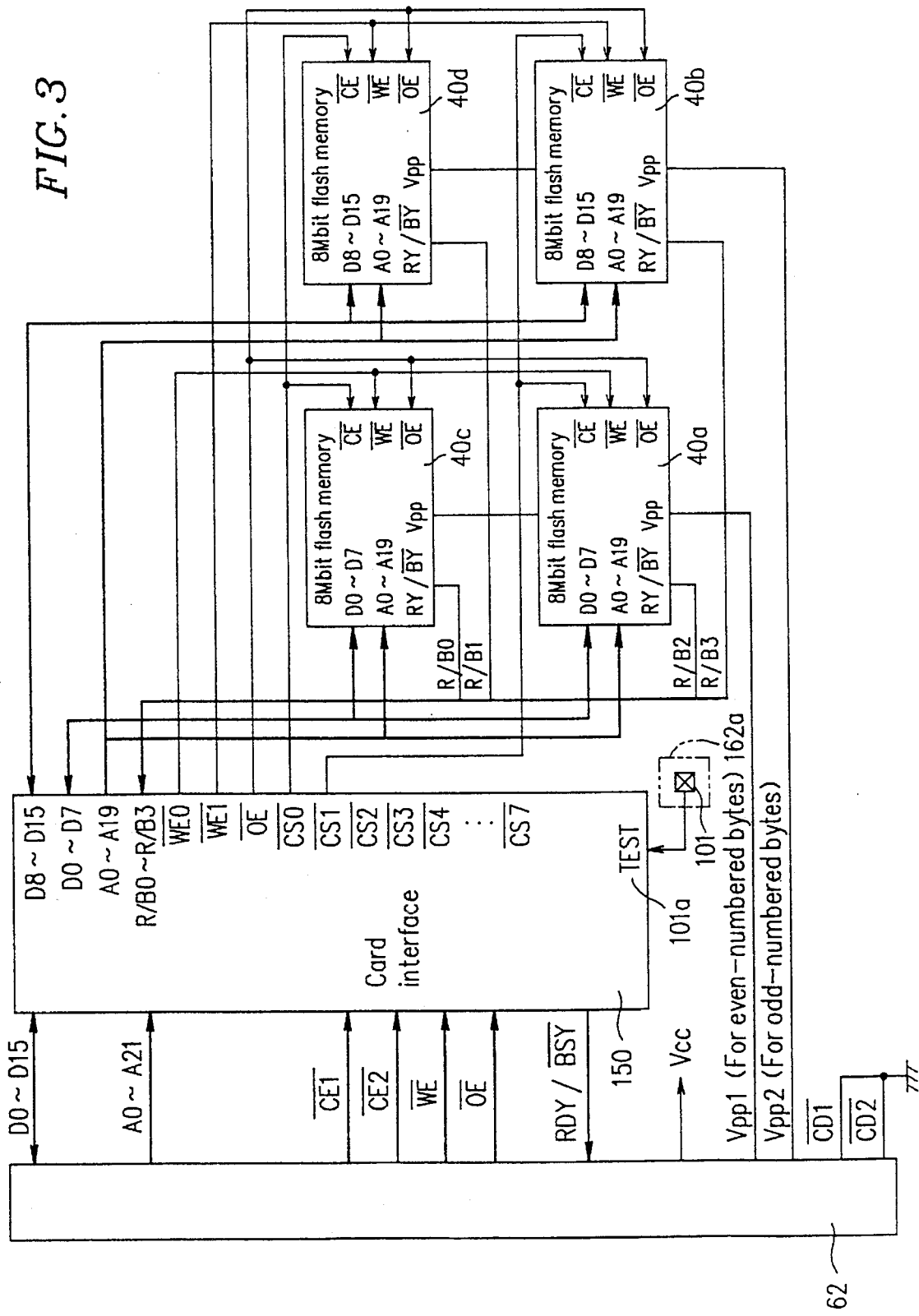
FIG. 3 is a diagram showing a flow of signals between a test card connector to be applied to the PC card according to the first example, a card interface of the PC card, and flash memories incorporated in the PC card.
Figure 4:
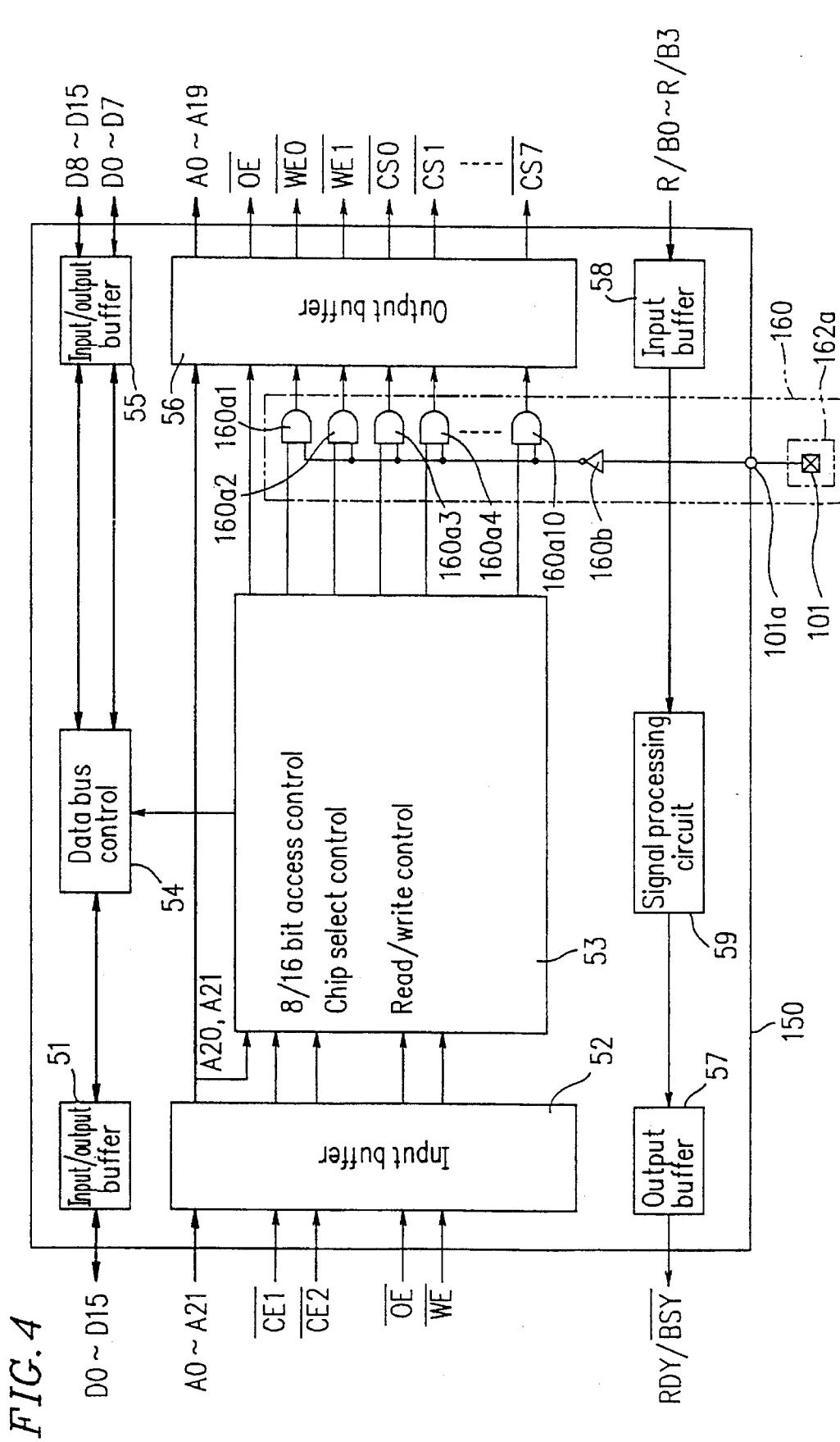
FIG. 4 is a block diagram showing a configuration for a card interface included in the PC card according to the first example.

FIG. 3 is a block diagram showing a flow of signals between the test card connector 62, the card interface 150, and the flash memories 40a to 40d. FIG. 4 is a detailed block diagram showing the internal configuration of the card interface 150.

The test circuit 160 shown in FIG. 4 includes ten AND circuits 160a1 to 160a10, an inverter 160b provided in the card interface 150, and a test terminal (TEST) 101a. The test circuit 160 can be set so as to become active when the level of the test terminal 101a is at the H level.

The card interface 150 receives address signals A0 to A21, chip enable signals /CE1 and /CE2, a write enable signal /WE, and an output enable signal /OE from, for example, the test card connector 62. These signals are input to an input buffer 52 of the card interface 150. Among the signals input to the input buffer 52, the address signals A20 and A21, the chip enable signals /CE1 and /CE2, the write enable signal /WE, and the output enable signal /OE are input to a controller 53. As described earlier, the controller 53 generates write enable signals /WE0 and /WE1 and chip select signals /CS0 to /CS7 based on the signals input to the controller 53. These signals generated by the controller 53 are input to one of the input terminals of the respective AND circuits 160a1 to 160a10. The other input terminals of the respective AND circuits 160a1 to 160a10 are connected to the signal input pad 101 via the inverter 160b via the test terminal 101a.

When the test terminal 101a is at the H level, the input terminals of the AND circuits 160a1 to 160a10 that are connected to the signal input pad 101 are at the L level, so that the signals input to the test circuit 160 are not outputted to the output buffer 56.

When the test terminal 101a is at the L level, the input terminals of the respective AND circuits 160a1 to 160a10 that are connected to the signal input pad 101 are at the H level, so that the signals input to the test circuit 160, i.e., the write enable signals /WE0 and /WE1 and the chip select signals /CS0 to /CS7, are output to the output buffer 56. The output buffer 56 outputs the outputs from the test circuit 160, the output enable signal /OE, and the address signals A0 to A19 to the corresponding flash memories 40a to 40d.

When the test terminal 101a is at the H level, the PC card 100 is in a test mode. When the test terminal 101a is at the L level, the PC card 100 is in a normal card operation mode.

A writing test and an erasing test are performed for each of the flash memories 40a to 40d of the above-described PC card 100 after mounting necessary devices, e.g., the flash memories 40a to 40d and the card interface 150, and after sealing the entire card substrate 30 with the packaging member 10a.

A data signal is input to the flash memories 40a to 40d via a data bus control 54 for converting 16-bit data to 8-bit data or vice versa and via an input/output buffer 55.

The card interface 150 receives ready busy signals R/B0 to R/B3 from the flash memories 40a to 40d. The ready busy signals R/B0 to R/B3 are output to the card socket 5 (not shown) of the test card connector 62 via an input buffer 58 and an output buffer 57 for a signal processing circuit 59, which are provided in the card interface 150.

The writing test for the flash memories 40a to 40d mounted on the card substrate 30 will be described below.

Figure 5:
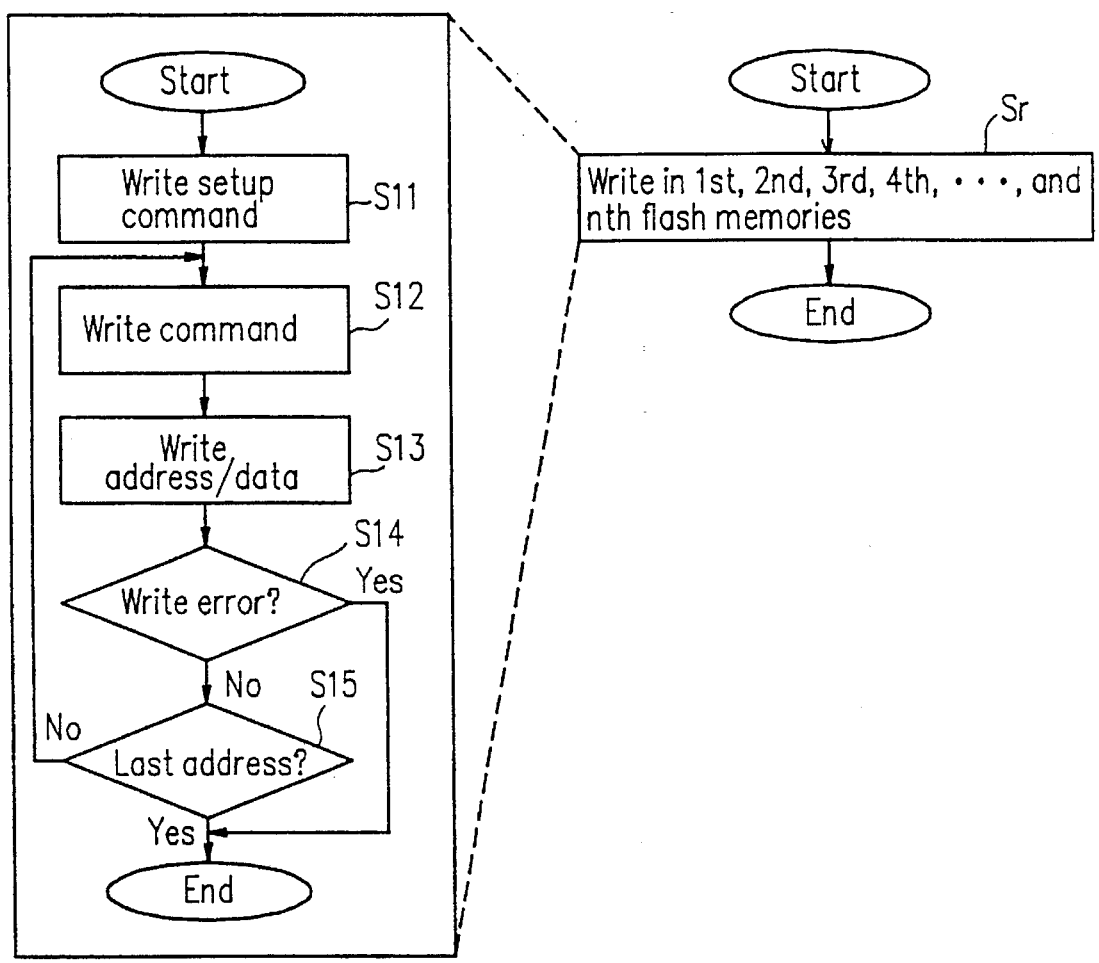
FIG. 5 is a flow diagram showing the steps performed in a writing test for the PC card according to the first example.

FIG. 5 is a flowchart showing the process of the writing test for the PC card 100 according to the present example.

According to the present example, the writing test process for all the flash memories 40a to 40d mounted on the card substrate 30 is performed by a parallel writing process (step Sr). In contrast, a conventional apparatus would require the process from steps S11 to S15 to be repeated four times in order to perform a writing test for all the flash memories 40a to 40d.

Hereinafter, a method for performing the writing test by the byte access method will be described in detail.

Figure 6:
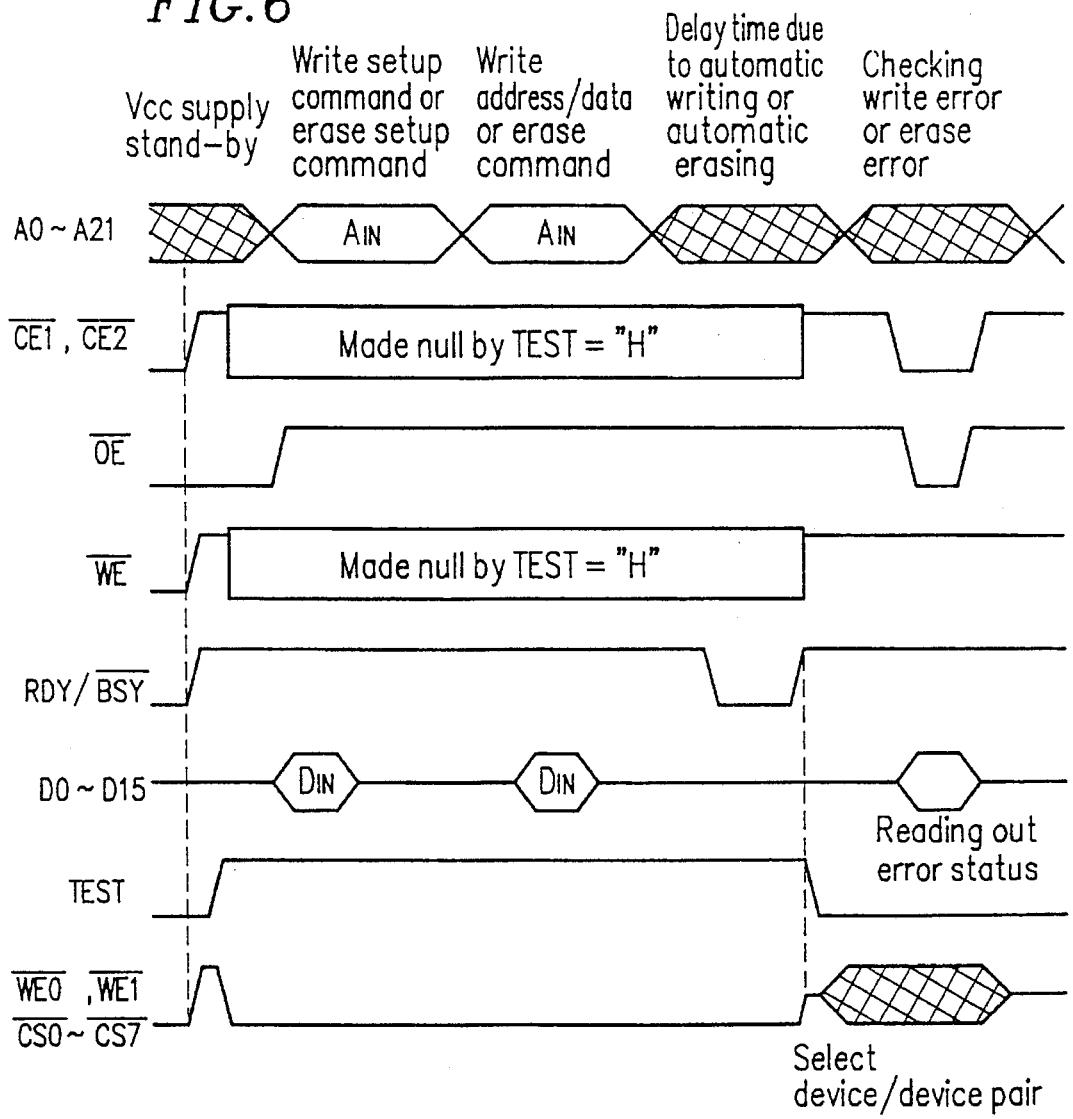
FIG. 6 is a timing diagram showing the change of various data signals, address signals, control signals, and the like in a writing test and an erasing test for the PC card according to the first example.

FIG. 6 is a timing diagram showing the change of various signals to which access is made between the controller 53, the flash memories 40a to 40d, the test card connector 62, and the probe 162a.

Figure 7:
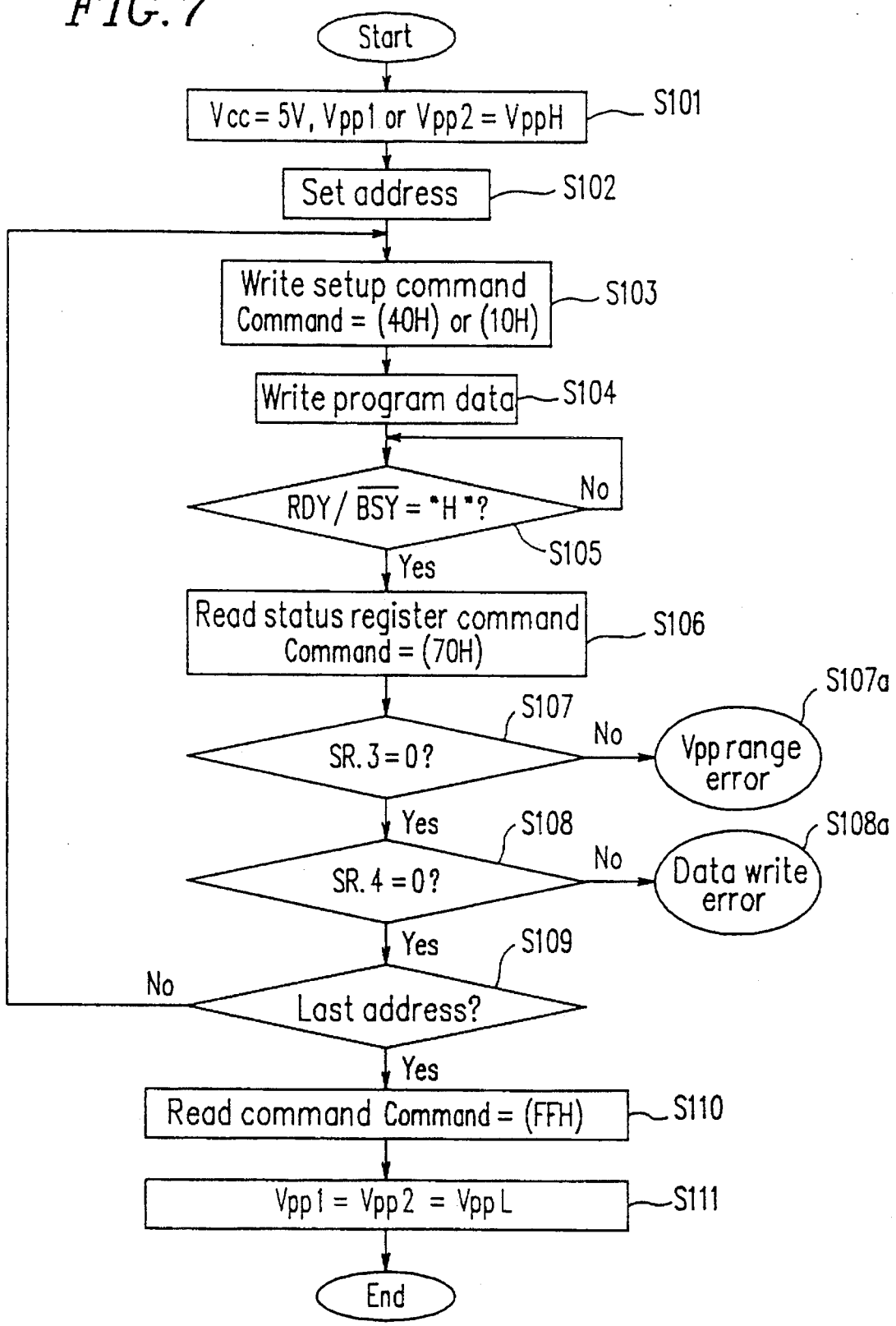
FIG. 7 is a flow diagram showing the steps performed in a writing test for the PC card according to the first example.

FIG. 7 is a flowchart showing a process performed by a CPU (Central Processing Unit) of the test apparatus main body 60a during the writing test.

The card substrate 30 carrying the necessary devices mounted thereon, e.g., the flash memories 40a to 40d and the card interface 150, is attached to the support 60b of the test apparatus 60. Thus, it becomes possible to apply a test signal from the test apparatus main body 60a to the connection terminals 31 of the card substrate 30 via the test card connector 62. Furthermore, the probe 162a is brought into contact with the signal input pad 101 provided on the card substrate 30, so that it becomes possible to apply an active signal from the test apparatus main body 60a to the signal input pad 101. Then, the writing test is started.

At the first step S101, a supply voltage Vcc is set at the normal supply voltage of 5 V in order to drive the devices mounted on the card substrate 30, such as the card interface 150 and the flash memories 40a to 40d. Furthermore, a supply voltage Vpp1 (for even-numbered bytes) is set at a high voltage VppH (12 V±0.6 V) in order to write data in the flash memories 40a and 40c, which are for even-numbered bytes. A supply voltage Vpp2 (for odd-numbered bytes) is set at the high voltage VppH (12 V±0.6 V) in order to write data in the flash memories 40b and 40d, which are for odd-numbered bytes. By thus setting the supply voltage Vcc at 5 V and setting the supply voltage Vpp1 or Vpp2 at 12 V, either the flash memories 40a and 40c (which are for even-numbered bytes) or the flash memories 40b and 40d (which are for odd-numbered bytes) enters a test stand-by state.

For conciseness of the description, a case will be described where the supply voltage Vpp1 is set at 12 V. In this case, the flash memories for which a writing test is to be performed are the flash memories 40a and 40c.

In the test circuit 160 of the card interface 150, an H-level signal input at the test terminal 101a is inverted by the inverter 160b. As a result, an L-level signal is input to the other input terminal of each of the AND gates 160a1 to 160a10. Accordingly, the chip select signals /CS0 and /CS1 and the write enable signals /WE0 and /WE1 output from the controller 53 are interrupted by the test circuit 160. L-level signals are output from the output terminals of the card interface 150, from which the chip select signals /CS0 and /CS1 and the write enable signals /WE0 and /WE1 are output. In other words, by applying an active signal that sets the test terminal 101a at a certain level to the signal input pad 101, the flash memories 40a to 40d enter a test mode from a test stand-by state.

The signal (signal TEST) applied to the test terminal 101a or the signal input pad 101, the write enable signals /WE0 and /WE1, the chip select signals /CS0 to /CS7, and the states of the flash memories 40a to 40d are shown in Table 3 below.

TABLE 3

| TEST | /WE0 | /WE1 | /CS0 to /CS7 | State of flash memory |
|---|---|---|---|---|
| H | | | L level output | All devices are in a compulsory write enabled state |
| L | | | Output of the control circuit = output of the card interface | Depends on the signal from the connector |

As shown in Table 3, when the signal TEST is at the H level, the output terminals for the signals /WE0 and /WE1 and /CS0 to /CS7 output from the card interface 150 are at the L level, so that all the flash memories 40a to 40d are selected in a compulsory manner, and writing is allowed for all the flash memories 40a to 40d.

At step S102, an address of the flash memories 40a to 40d in which test data is to be written is set.

At step S103, a write setup command is executed. As a result, it becomes possible to write test data in the above-set address of the flash memories 40a to 40d.

At step S104, write program data is written in the above-set address of the flash memories 40a to 40d as the test data.

At step S105, the CPU of the test apparatus main body 60a monitors a ready busy signal RDY//BSY from each of the flash memories 40a to 40d. Each flash memory outputs an L-level ready busy signal RDY//BSY while automatic writing is conducted, and outputs an H-level ready busy signal RDY//BSY while automatic writing is not conducted.

If at least one of the ready busy signals R/B0 to R/B3 output from the flash memories 40a to 40d is at the L level, the CPU of the test apparatus main body 60a stands by while monitoring the ready busy signal RDY//BSY which is at the L level during a delay time for which the automatic writing is conducted.

In other words, the CPU of the test apparatus main body 60a determines whether or not the ready busy signal RDY//BSY is at the H level at step S105. If the ready busy signal RDY//BSY is not at the H level, the step S105 is repeated until the ready busy signal RDY//BSY rises to the H level.

When the ready busy signal RDY//BSY rises to the H level, the CPU of the test apparatus main body 60a sets the active signal applied to the signal input pad 101 at the L level. The operation mode of each device enters a normal card operation mode from the test operation mode, whereby a write error checking is conducted for each flash memory.

At step S106, a status reading command is given to the first flash memory 40c, for which the writing test is to be conducted. The CPU of the test apparatus main body 60a determines whether or not the writing was successful by referring to the values of the status register 41 incorporated in the flash memory 40c. Hereinafter, such a judgment for the flash memory 40c will be described specifically.

At step S107, the CPU of the test apparatus main body 60a searches the content of the register SR.3 of the status register 41 of the flash memory 40c so as to determine whether data has been written by a proper writing voltage.

It is previously ensured that the register SR.3 is reset to "0" when a writing has been properly done, and that the register SR.3 is set to "1" when the writing has not been properly done.

If the content of the register SR.3 is determined to be "1", the process proceeds to step S107a. At step S107a, the voltage Vpp is determined to have a range error, so that the process is terminated.

If the content of the register SR.3 is determined to be "0", the process proceeds to step S108. At step S108, the CPU of the test apparatus main body 60a determines whether or not the writing in the above-set address has been successful based on the content of the register SR.4.

If the content of the register SR.4 is determined not to be "0", there has been a data writing error, so that the process proceeds to step S108a. At step S108a, the process is terminated.

In the case where the states of the status registers 41 are output to the test apparatus main body 61 by using the data bus, the confirmation of the state of the status register 41 is performed by repeating the process from step S106 to step S108 as large a number of times as the number of flash memories to be tested (not shown).

If the content of the register SR.4 is determined to be "0", the writing has been successful, so that the process proceeds to step S109. At step S109, it is determined whether or not the above-set address is the last address. If it is not the last address, the process returns to step S102, and the process from step S102 to step S109 is repeated.

If the above-set address is the last address of the flash memories 40a to 40d, the CPU of the test apparatus main body 60a executes a read command at step S110.

At step S111, the CPU of the test apparatus main body 60a sets the supply voltages Vpp1 and Vpp2 used for writing and erasing at a voltage VppL (0 to 6.5 V). As a result, the flash memories 40a to 40d enter a read state. Steps 110 and 111 are provided in order to prevent loss of data due to a malfunction of the flash memories 40a to 40d. The data is not lost since the flash memories 40a to 40d enter a read state when a writing or erasing operation has finished.

Next, a method for performing an erasing test for the flash memories 40a to 40d incorporated in the PC card 100 will be described.

Figure 8:
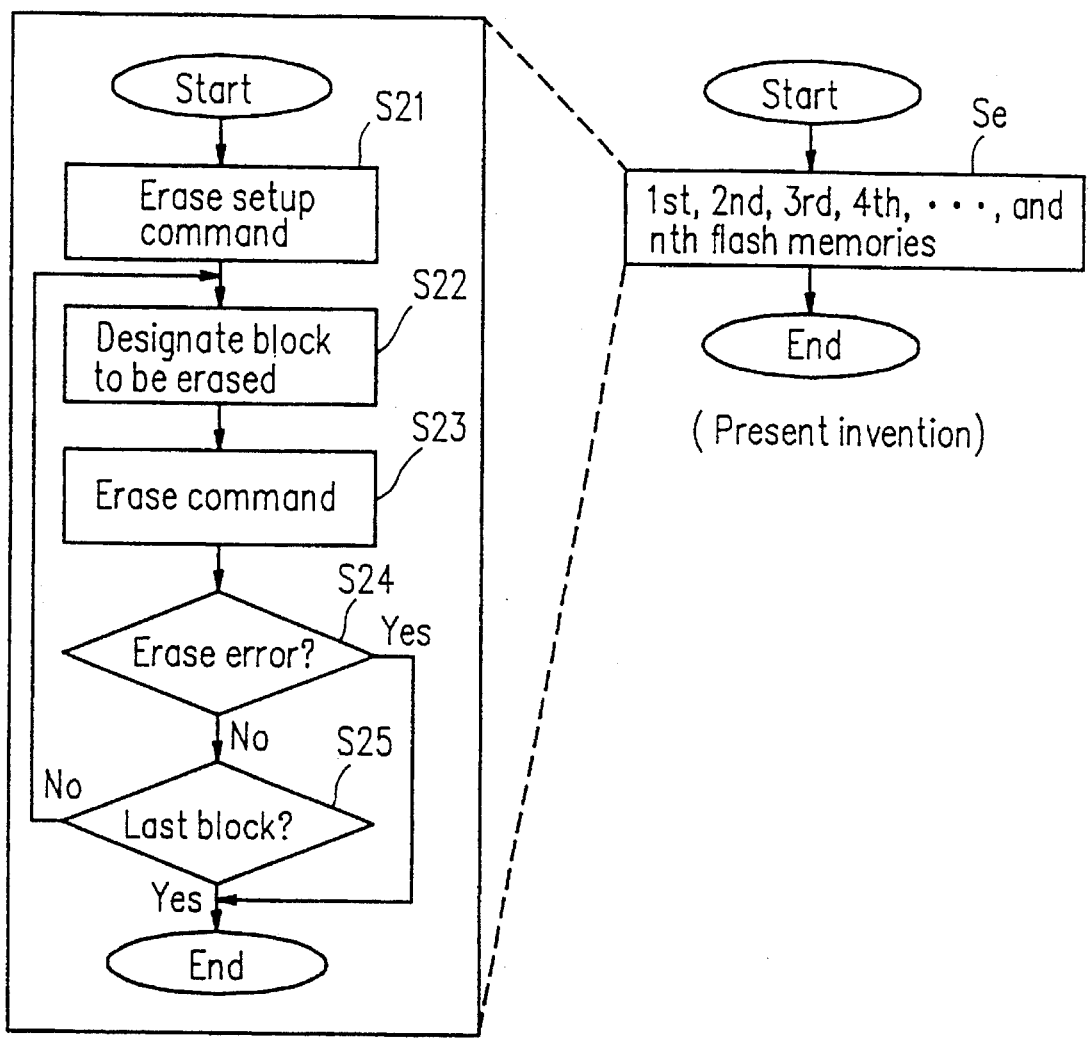
FIG. 8 is a flow diagram showing the steps performed in an erasing test for the PC card according to the first example.

FIG. 8 is a flowchart showing the process of the erasing test according to the present example.

According to the present example, the content of all the flash memories 40a to 40d mounted on the card substrate 30 is erased. In contrast, a conventional apparatus would require the process from steps S21 to S25 to be repeated as many times as the number of flash memories mounted on the card substrate 30.

Figure 9:
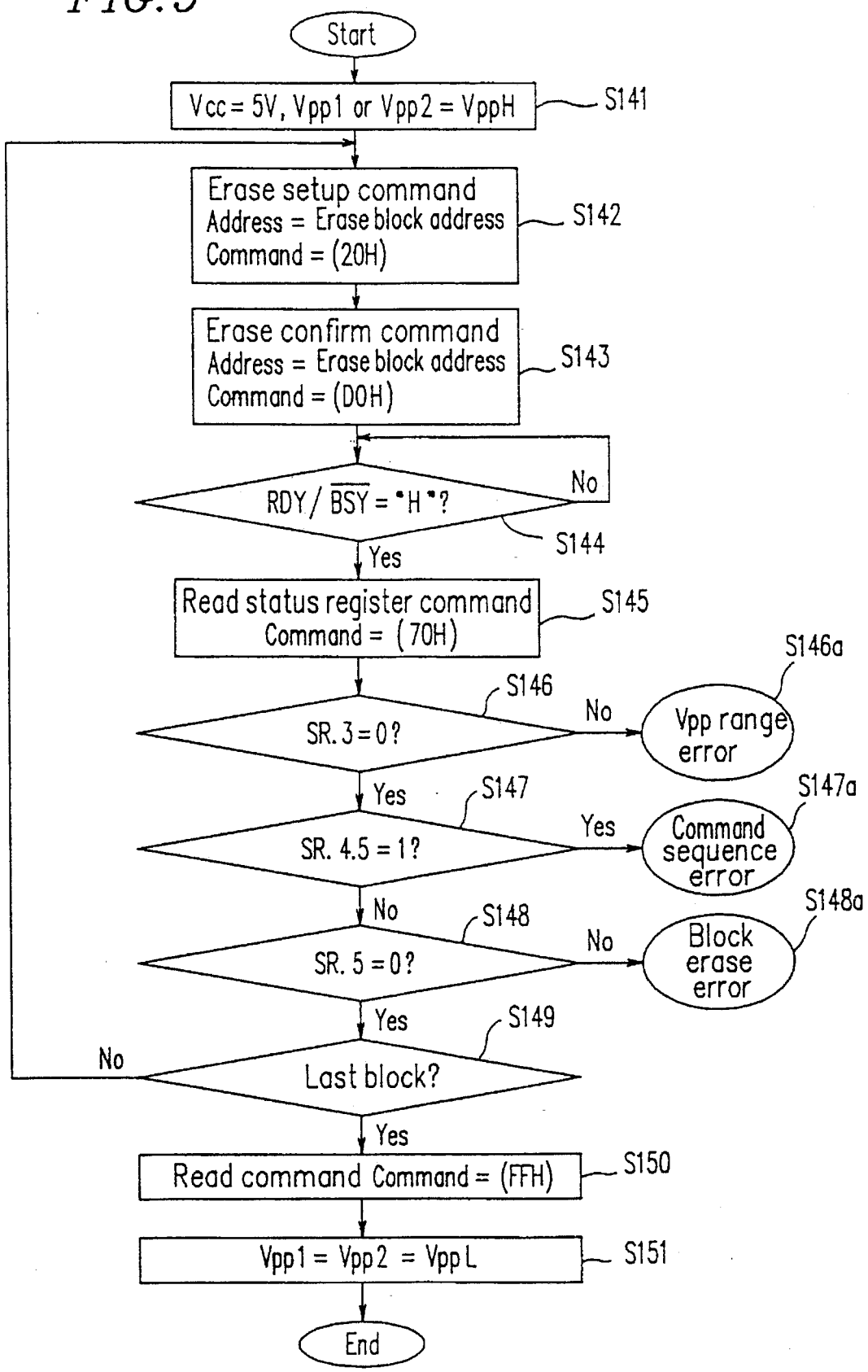
FIG. 9 is a flow diagram showing the steps performed in an erasing test for the PC card according to the first example.

FIG. 9 is a flowchart showing a method for performing the erasing test by the byte access method. The signals input to the flash memories 40a to 40d are illustrated in the timing chart shown in FIG. 6.

First, the card substrate 30 carrying the necessary devices mounted thereon, e.g., the flash memories 40a to 40d and the card interface 150, is attached to the support 60b of the test apparatus 60. Thus, it becomes possible to apply an active signal from the test apparatus main body 60a to the signal input pad 101. This step is the same as in the case of the writing test. Then, the erasing test is started.

At the first step S141, the supply voltage Vcc is set at the normal supply voltage of 5 V in order to drive the devices mounted on the card substrate 30, such as the card interface 150 and the flash memories 40a to 40d. Furthermore, the supply voltage Vpp1 and/or Vpp2 used for writing and erasing is set at an erasing level voltage VppH (12 V±0.6 V). By thus setting the supply voltage Vcc at 5 V and setting the supply voltage Vpp1 or Vpp2 at 12 V, either the flash memories 40a and 40c (which are for even-numbered bytes) or the flash memories 40b and 40d (which are for odd-numbered bytes) enters a test stand-by state.

For conciseness of the description, a case will be described where the supply voltage Vpp1 is set at 12 V. In this case, the flash memories for which a writing test is to be performed are the flash memories 40a and 40c.

In this state, the test apparatus main body 60a applies an active signal that sets the test terminal 101a at the H level to the signal input pad 101, so that the flash memories 40a to 40d on the card substrate 30 enter a test mode from a test stand-by state.

An L-level signal is supplied to the output terminals for the signals /WE0 and /WE1 and /CS0 to /CS7 for all the flash memories 40a to 40d, so that it becomes possible to make access to the flash memories 40a to 40d in a test stand-by state. In this state, it is possible to perform either a write operation or an erasing operation in a parallel manner.

At step S142, an address of a block of each flash memory in which test data is to be erased is set.

At step S143, an erase confirm command is executed. As a result, the data in the block of the above-set address of each of the flash memories 40a to 40d in a test stand-by state is erased.

Thereafter, the CPU of the test apparatus main body 60a monitors the ready busy signal RDY//BSY. The CPU of the test apparatus main body 60a stands by while monitoring the ready busy signal RDY//BSY during a delay time for which the automatic erasing is conducted. In other words, at step S144, the CPU of the test apparatus main body 60a determines whether or not the ready busy signal RDY//BSY is at the H level at step S144. If the ready busy signal RDY//BSY is not at the H level, the step S144 is repeated until the ready busy signal RDY//BSY rises to the H level.

When the ready busy signal RDY//BSY rises to the H level, the CPU of the test apparatus main body 60a applies an L-level voltage to the signal input pad 101. The operation mode of each device enters a normal card operation mode from the test operation mode, whereby an erase error checking is conducted. The erase error checking is sequentially performed for each flash memory.

At step S145, a status reading command is given to each flash memory.

At steps S146 to S149, the CPU of the test apparatus main body 60a determines whether or not the erasing was successful by referring to the values of the status register 41 incorporated in the flash memory. Hereinafter, such a judgment for the flash memory 40c will be described specifically.

At step S146, the CPU of the test apparatus main body 60a searches the content of the register SR.3 of the status register 41 so as to determine whether data has been erased by a proper erasing voltage.

The register SR.3 is reset to "0" when an erasing has been properly done, and the register SR.3 is set to "1" when the erasing has not been properly done.

If the content of the register SR.3 is determined to be "1", the process proceeds to step S146a. At step S146a, the voltage Vpp is determined to have a range error, so that the CPU of the test apparatus main body 60a terminates the erasing test process.

If the content of the register SR.3 is determined to be "0", the process proceeds to step S147. At step S147, the CPU of the test apparatus main body 60a determines if the value of the register SR.4 is "1" and the value of the register SR.5 is also "1". Thus, the CPU checks whether or not a command sequence error has occurred during the erasing. If the values of the registers SR.4 and SR.5 are both "1", it is determined that a command sequence error has occurred, and the process proceeds to step S147a. If the value of the register SR.4 is not 1 and/or the value of the register SR.5 is not 1, the process proceeds to step S148.

At step S147a, the CPU of the test apparatus main body 60a terminates the erasing test process.

At step 148, if the content of the register SR.5 is determined to be "0", it is determined that there has been a block error, and the process proceeds to step S148a.

At step S148a, the CPU of the test apparatus main body 60a terminates the erasing test process.

In other words, the process at steps S147 and S148 confirms that the erasing test has been successful by confirming that the values of the registers SR.4 and SR.5 are both "0".

In the case where the states of the status registers 41 are output to the test apparatus main body 61 by using the data bus, the confirmation of the state of the status register 41 is performed by repeating the process from step S106 to step S108 as large a number of times as the number of flash memories to be tested (not shown).

At step S149, the CPU of the test apparatus main body 60a determines whether or not the above-set block is the last block. If it is not the last block, the process returns to step S142, and the process from step S142 to step S149 is repeated. If it is the last block, the process proceeds to step S150.

At step S151, the CPU of the test apparatus main body 60a sets the supply voltages Vpp1 and Vpp2 used for writing and erasing at a voltage VppL (0 to 6.5 V), and a read command is executed. As a result, the flash memories 40a to 40d enter a read state. Steps S150 and S151 are provided to prevent loss of data due to a malfunction of the flash memories 40a to 40d, as described in more detail above.

In accordance with the PC card 100 of the present example, the card interface 150 for controlling access to and from external signals includes a test circuit 160 for applying signal voltages to a plurality of control signal output terminals such that the flash memories 40a to 40d are placed in a write enabled state when an active signal is applied. The PC card 100 includes the signal input pad 101 for inputting the active signal to the test circuit 160. By applying the active signal to the signal input pad 101 from outside the PC card 100, the flash memories 40a to 40d enter a write enabled state. Therefore, by executing a write command or erase command once for the flash memories 40a to 40d in the write enabled state, the flash memories 40a to 40d can be parallel written or parallel erased.

As a result, according to the present example, the time required for a writing test or an erasing test for a plurality of flash memories mounted on a substrate of an IC card can be reduced. Thus, the time needed for the production test process for IC cards is effectively prevented from increasing as the high-density mounting technique for IC cards improves.

According to the present example, only one signal input pad 101 is required in the PC card 100, so that the various devices on the card substrate 30 are hardly subject to any positional restraints.

EXAMPLE 2

Hereinafter, a parallel processing method for flash memories according to Example 2 of the present invention will be described.

The structure of a PC card 100 of Example 2 is identical with that the PC card 100 of Example 1. One difference between the methods of Example 1 and Example 2 is that the writing test and erasing test for flash memories 40a to 40d incorporated in the PC card 100 are performed by the word access method, instead of the byte access method, according to Example 2. Accordingly, the writing test and erasing test by the word access method will be described.

First, the writing test by the word access method will be described.

Figure 10:
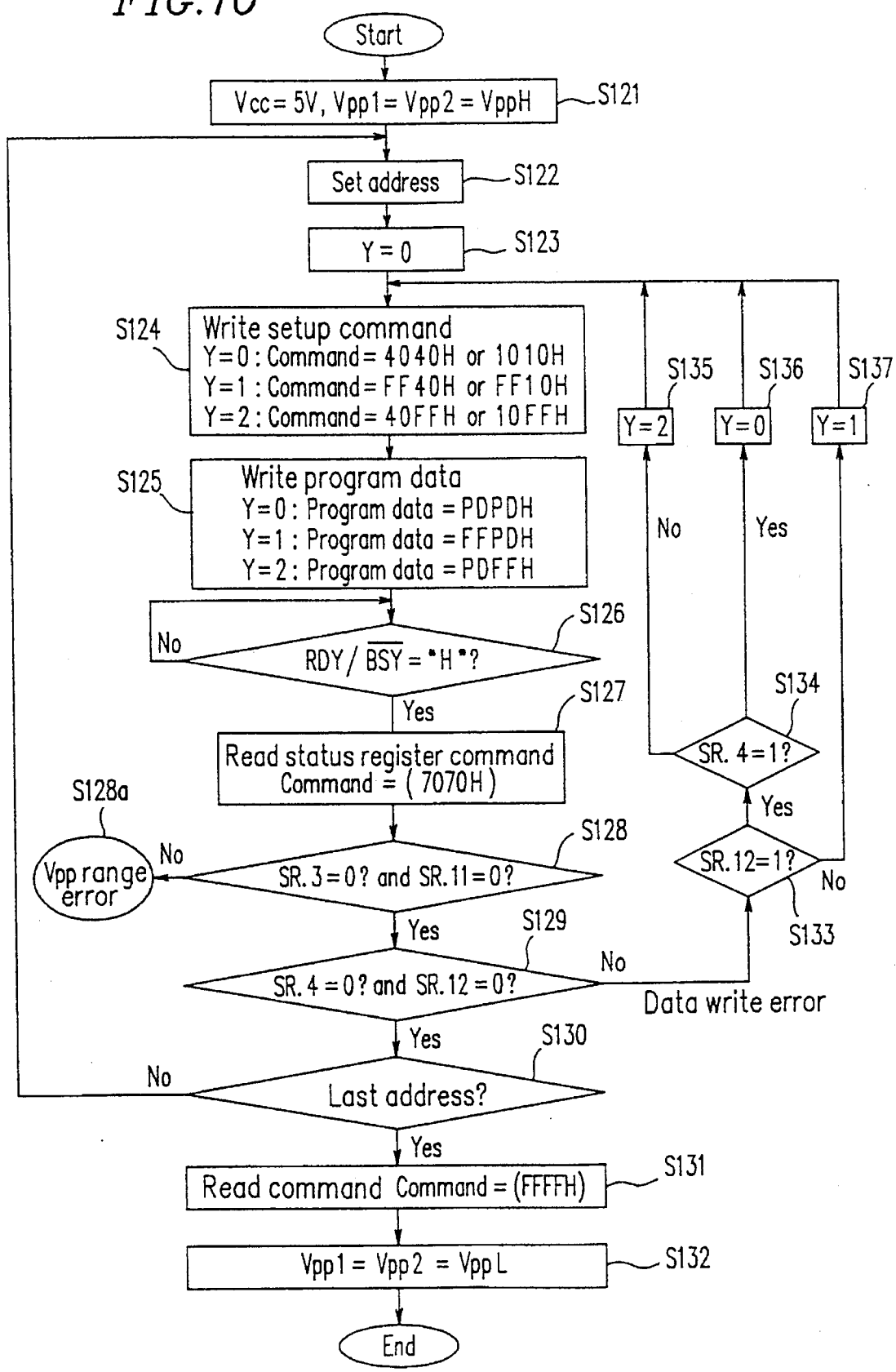
FIG. 10 is a flow diagram showing the steps performed in a writing test for a PC card as a method for performing parallel processes for flash memories according to a second example of the present invention.

FIG. 10 is a flowchart showing the process performed by a CPU of a test apparatus main body 60a. First, as in Example 1, a card substrate 30 carrying the necessary devices mounted thereon, e.g., the flash memories 40a to 40d and a card interface 150, is attached to a support 60b of a test apparatus 60. Thus, it becomes possible to apply a test signal from the test apparatus main body 60a to the devices on the card substrate 30. Then, the writing test is started.

At step S121, the test apparatus main body 60a sets a supply voltage Vcc at the normal supply voltage of 5 V in order to drive the devices mounted on the card substrate 30, such as the card interface 150 and the flash memories 40a to 40d. Furthermore, the test apparatus main body 60a sets supply voltages Vpp1 and Vpp2 for writing and erasing at a writing level voltage VppH (12 V±0.6 V). As a result, all the flash memories 40a and 40d are placed in a stand-by state.

The test apparatus main body 60a supplies an input signal that sets a test terminal 101a at the H level to a signal input pad 101. As a result, the card interface 150 and the flash memories 40a to 40d enter a test operation mode.

As in Example 1, chip select signals /CS0 and /CS1 and write enable signals /WE0 and /WE1 output from a controller 53 are interrupted by a test circuit 160 of the card interface 150. L-level signals are output from the output terminals of the card interface 150, from which the chip select signals /CS0 and /CS1 and the write enable signals /WE0 and /WE1 are output. In other words, all the flash memories 40a to 40d become accessible.

At step S122, an address of each flash memory in which test data is to be written is set.

At step S123, a write setup command is selected by a user. The write setup command will now be described. According to the present example, a command for setting up one pair of flash memories, a command for setting up one of flash memories of that pair, and a command for setting up the other of the flash memories of that pair are provided. One of these write setup commands is selected when performing a predetermined process in the writing test. At step S123 shown in FIG. 10, Y=0 is set as selection information, indicating that one pair of flash memories are set up.

At step S124, the write setup command selected at step S123 is executed. In the case where Y=0, it is possible to write test data in the above-set address of the flash memories 40a to 40d.

At step S125, write program data is written in the above-set address of the flash memories 40a to 40d as the test data.

At step S126, the CPU of the test apparatus main body 60a monitors a ready busy signal RDY//BSY from each of the flash memories 40a to 40d. Each flash memory outputs an L-level ready busy signal RDY//BSY while automatic writing is conducted, and outputs an H-level ready busy signal RDY//BSY while automatic writing is not conducted. In other words, the CPU of the test apparatus main body 60a determines whether or not the ready busy signal RDY//BSY is at the H level at step S126. If the ready busy signal RDY//BSY is not at the H level, the step S125 is repeated until the ready busy signal RDY//BSY rises to the H level.

When the ready busy signal RDY//BSY rises to the H level, the process proceeds to step S127.

At step S127, an L-level signal is applied to the signal input pad 101. As a result, the operation mode of each device enters a normal card operation mode from the test operation mode, and the CPU of the test apparatus main body 60a conducts a write error checking.

For example, the first flash memory 40c and the second flash memory 40d are selected as a pair, and a status read command is applied thereto. Then, the CPU of the test apparatus main body 60a determines whether or not the writing was successful by referring to the values of the status registers 41 incorporated in the flash memories 40c and 40d.

The writing error judgment in the present example is sequentially conducted for pairs of flash memories, each pair consisting of two flash memories.

The reading out of the status registers 41 will now be described. The values in the status registers 41 are read out as a 16-bit word combining the content of the status registers 41 (registers SR.0 to SR.7) of the devices for even-numbered bytes and the content of the status registers 41 of the devices for odd-numbered bytes (registers SR.0 to SR.7), as shown in Table 4 below:

TABLE 4

| (bit) | | | | | | | | | | | | | | | |
|---|---|---|---|---|---|---|---|---|---|---|---|---|---|---|---|
| 15 | 14 | 13 | 12 | 11 | 10 | 9 | 8 | 7 | 6 | 5 | 4 | 3 | 2 | 1 | 0 |
| SR7 | SR6 | SR5 | SR4 | SR3 | SR2 | SR1 | SR0 | SR7 | SR6 | SR5 | SR4 | SR3 | SR2 | SR1 | SR0 |

In the description below, the registers SR.0 to SR.7 of the status register 41 of the flash memories for odd-numbered bytes correspond to bit 8 to bit 15 shown in Table 4 above, while the registers SR.0 to SR.7 of the status register 41 of the flash memories for even-numbered bytes correspond to bit 0 to bit 7.

Hereinafter, the above-mentioned judgment for one pair of flash memories 40c and 40d will be described specifically.

At step S128, the CPU of the test apparatus main body 60a searches the content of the registers SR.3 and SR.11 of the status registers 41 of the flash memories 40c and 40d so as to determine whether data has been written by a proper writing voltage.

The registers SR.3 and SR.11 are reset to "0" when a writing has been properly done, and at least one of the registers SR.3 and SR.11 is set to "1" when the writing has not been properly done.

If the content of the register SR.3 or SR.11 is determined not to be "0", the process proceeds to step S128a. At step S128a, the voltage Vpp is determined to have a range error, so that the process is terminated.

If the contents of the register SR.3 and SR.11 are both determined to be "0", the process proceeds to step S129. At step S129, the CPU of the test apparatus main body 60a determines whether or not the writing in the above-set address has been successful based on the contents of the registers SR.4 and SR.12.

If the contents of the register SR.4 and SR.12 are both determined not to be "0", there has been a data writing error, so that the process proceeds to step S133. If the contents of the register SR.4 and the register SR.12 are both determined to be "0", the writing has been successful, so that the process proceeds to step S130.

At step S133, it is determined whether or not the error has occurred in a device (flash memory) for odd-numbered bytes by referring to the content of the register SR.12. If the value of the register SR.12 is "1", the process proceeds to step S134. If the value of the register SR.12 is not "1", the process proceeds to step S137.

At step S137, the selection information Y is set at 1 (Y=1) because the error has occurred in a flash memory for even-numbered bytes. Accordingly, writing is conducted again only for the flash memories for even-numbered bytes at steps S124 and S125.

At step S134, it is determined whether or not the error has occurred in a device (flash memory) for even-numbered bytes by referring to the content of the register SR.4. If the value of the register SR.4 is "1", the process proceeds to step S136. If the value of the register SR.4 is not "1", the process proceeds to step S135.

At step S135, the selection information Y is set at 2 (Y=2) because the error has occurred in a flash memory for odd-numbered bytes. Accordingly, writing is conducted again only for the flash memories for odd-numbered bytes at step S124.

At step S136, the selection information Y is set at 0 (Y=0) because an error has occurred in both a flash memory for odd-numbered bytes and a flash memory for even-numbered bytes. Accordingly, writing is conducted again for both flash memories for odd-numbered bytes and flash memories for even-numbered bytes at step S124.

At step S130, it is determined whether or not the address in which the writing has been conducted is the last address. If it is not the last address, the process returns to step S122, and the process from step S122 to step S130 is repeated.

If the above-mentioned address is the last address of the flash memories, the CPU of the test apparatus main body 60a executes a read command at step S131.

At step S132, the CPU of the test apparatus main body 60a sets the supply voltages Vpp1 and Vpp2 used for writing and erasing at a read state voltage VppL (0 to 6.5 V). As a result, the flash memories 40a to 40d enter a read state.

Next, the erasing test for the flash memories 40a to 40d by the word access method will be described.

Figure 11:
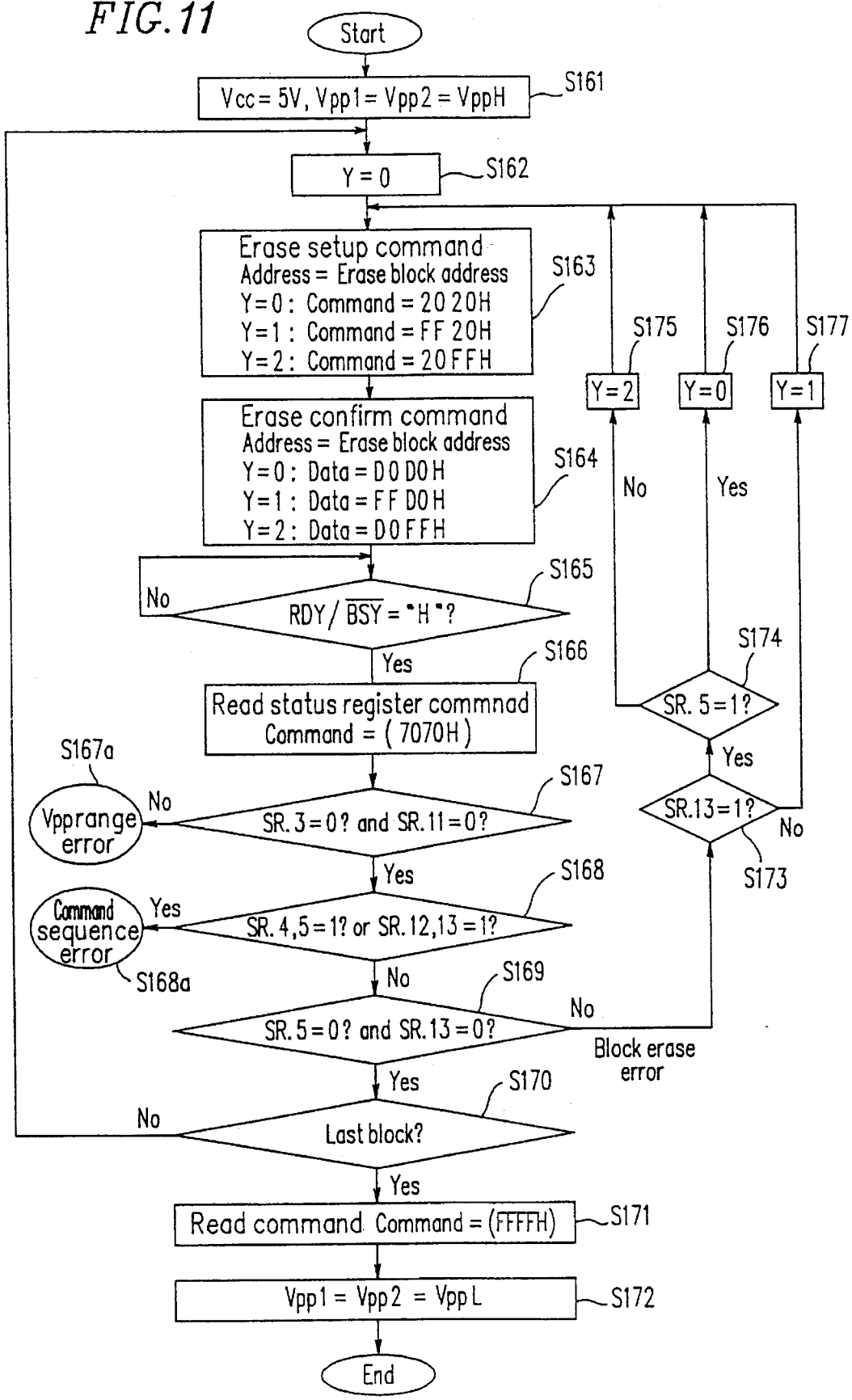
FIG. 11 is a flow diagram showing the steps performed in an erasing test for a PC card as a method for performing parallel processes for flash memories according to a second example of the present invention.

FIG. 11 is a flowchart showing the process performed by the CPU of the test apparatus main body 60a.

At the first step S161, the test apparatus main body 60a sets a supply voltage Vcc at the normal supply voltage of 5 V in order to drive the devices mounted on the card substrate 30, such as the card interface 150 and the flash memories 40a to 40d. Furthermore, the test apparatus main body 60a sets supply voltages Vpp1 and Vpp2 for writing and erasing at an erasing level voltage VppH (12 V±0.6 V). As a result, all the flash memories 40a and 40d are placed in a stand-by state.

The test apparatus main body 60a supplies an signal input that sets a test terminal 101a at the H level to the signal input pad 101. As a result, the card interface 150 and the flash memories 40a to 40d enter a test operation mode.

The chip select signals /CS0 and /CS1 and the write enable signals /WE0 and /WE1 output from the controller 53 are interrupted by a test circuit 160 of the card interface 150. As a result, L-level signals are output from the output terminals of the card interface 150, from which the chip select signals /CS0 and /CS1 and the write enable signals /WE0 and /WE1 are output. In other words, all the flash memories 40a to 40d become accessible.

At step S162, an erase setup command is selected by a user. According to the present example, a command for setting up one pair of flash memories, a command for setting up one of the flash memories of that pair, and a command for setting up the other of the flash memories of that pair are provided. One of these erase setup commands is selected when performing a predetermined process in the erasing test. At step S162 shown in FIG. 11, Y=0 is set as selection information, indicating that one pair of flash memories are set up.

At step S163, the erase setup command for setting up one pair of flash memories is executed, and a block of each flash memory that contains information to be erased is set. Thus, it becomes possible to erase the information in the above-set block of all the flash memories 40a to 40d.

At step S164, an erase confirm command is executed. As a result, the data in the above-set block of the flash memories 40a to 40d is erased.

At step S165, the CPU of the test apparatus main body 60a monitors the ready busy signal RDY//BSY while automatic erasing is conducted. In other words, the CPU of the test apparatus main body 60a determines whether or not the ready busy signal RDY//BSY is at the H level. If the ready busy signal RDY//BSY is not at the H level, the step S165 is repeated until the ready busy signal RDY//BSY rises to the H level.

When the ready busy signal RDY//BSY rises to the H level, the process proceeds to step S166.

At step S166, an L-level signal is applied to the signal input pad 101. As a result, the operation mode of each device on the card substrate 30 enters a normal card operation mode from the test operation mode, and the CPU of the test apparatus main body 60a conducts an erase error checking.

For example, the first flash memory 40c and the second flash memory 40d are selected as a pair, and a status read command is applied thereto. Then, the CPU of the test apparatus main body 60a determines whether or not the erasing was successful by referring to the values of the status registers 41 incorporated in the flash memories 40c and 40d. The erase error judgment in the present example is sequentially conducted for pairs of flash memories, each pair consisting of two flash memories.

The reading out of the status registers 41 will now be described. As shown in Table 4 above, the values in the status registers 41 are read out as a 16-bit word combining the content of the status registers 41 (registers SR.0 to SR.7) of the devices for even-numbered bytes and the content of the status registers 41 of the devices for odd-numbered bytes (registers SR.0 to SR.7).

In the description below, the registers SR.0 to SR.7 of the status register 41 of the flash memories for odd-numbered bytes correspond to bit 8 to bit 15 shown in Table 4, while the registers SR.0 to SR.7 of the status register 41 of the flash memories for odd-numbered bytes correspond to bit 0 to bit 7.

Hereinafter, the above-mentioned judgment for one pair of flash memories 40c and 40d will be described specifically.

At step S167, the CPU of the test apparatus main body 60a searches the content of the registers SR.3 and SR.11 of the status registers 41 of the flash memories 40c and 40d so as to determine whether data has been erased by a proper erasing voltage.

The registers SR.3 and SR.11 are reset to "0" when an erasing has been properly done, and at least one of the registers SR.3 and SR.11 is set to "1" when the erasing has not been properly done.

If the content of the register SR.3 is determined not to be "0" and/or the content of the register SR.11 is determined not to be "0", the process proceeds to step S167a. At step S167a, the voltage Vpp is determined to have a range error, so that the process is terminated.

If the contents of the register SR.3 and SR.11 are both determined to be "0", the process proceeds to step S168.

At step S168, it is determined whether or not the values of both the register SR.4 and the register SR.5 are "1". It is also determined, in a disjunctive manner, whether or not the values of both the registers SR.12 and SR.13 are "1". Thus, the CPU of the test apparatus main body 60a determines whether or not a command sequence error has occurred during the erasing operation.

If the values of the registers SR.4 and SR.5 are both determined to be "1", or if the values of the register SR.12 and SR.13 are both determined to be "1", the process proceeds to step S168a. At step S168a, since it is determined that a command sequence error has occurred, the process is terminated. If no command sequence error has occurred, the process proceeds to step S169.

At step 169, if the value of the register SR.5 is determined not to be "0" and/or the value of the register SR.13 is determined not to be "0" (step S169), a block error is determined to have occurred, so that the process proceeds to the step S173.

At step S173, it is determined whether or not the error has occurred in a device (flash memory) for odd-numbered bytes by referring to the content of the register SR.13. If the value of the register SR.13 is "1", the process proceeds to step S174. If the value of the register SR.13 is not "1", the process proceeds to step S177 since it is established that the error has occurred in a flash memory for even-numbered bytes.

At step S177, the selection information Y is set at 1 (Y=1). Accordingly, erasing is conducted again only for the flash memories for even-numbered bytes at steps S163.

At step S174, it is determined whether or not the error has occurred in a device (flash memory) for even-numbered bytes by referring to the content of the register SR.5. If the value of the register SR.5 is not "1", the process proceeds to step S175, since the error has occurred in a device (flash memory) for odd-numbered bytes.

At step S175, the selection information Y is set at 2 (Y=2) because the error has occurred in a flash memory for odd-numbered bytes. Accordingly, erasing is conducted again only for the flash memories for odd-numbered bytes at step S163.

If the value of the register SR.5 is "1" at step S174, the process proceeds to step S176, since an error has occurred in both a flash memory for odd-numbered bytes and a flash memory for even-numbered bytes.

At step S176, the selection information Y is set at 0 (Y=0), and erasing is conducted again for both flash memories for odd-numbered bytes and flash memories for even-numbered bytes at step S163.

If the contents of the registers SR.5 and SR.13 are both "0" as a result of the judgement at step S169, the erasing operation has been successful, so that the process proceeds to step S170.

At step S170, it is determined whether or not the block for which the erasing has been conducted is the last block. If it is not the last block, the process returns to step S162, and the process from step S162 to step S170 is repeated.

If the above-mentioned block is the last block of the flash memory, the CPU of the test apparatus main body 60a executes a read command at step S171.

At step S172, the CPU of the test apparatus main body 60a sets the supply voltages Vpp1 and Vpp2 used for writing and erasing at a read state voltage VppL (0 to 6.5 V). As a result, the flash memories 40a to 40d enter a read state.

Thus, according to the present example, the writing test and the erasing test are conducted by the word access method, so that less time is required for the writing and erasing check in each test as compared with the methods of Example 1.

EXAMPLE 3

Figure 12:
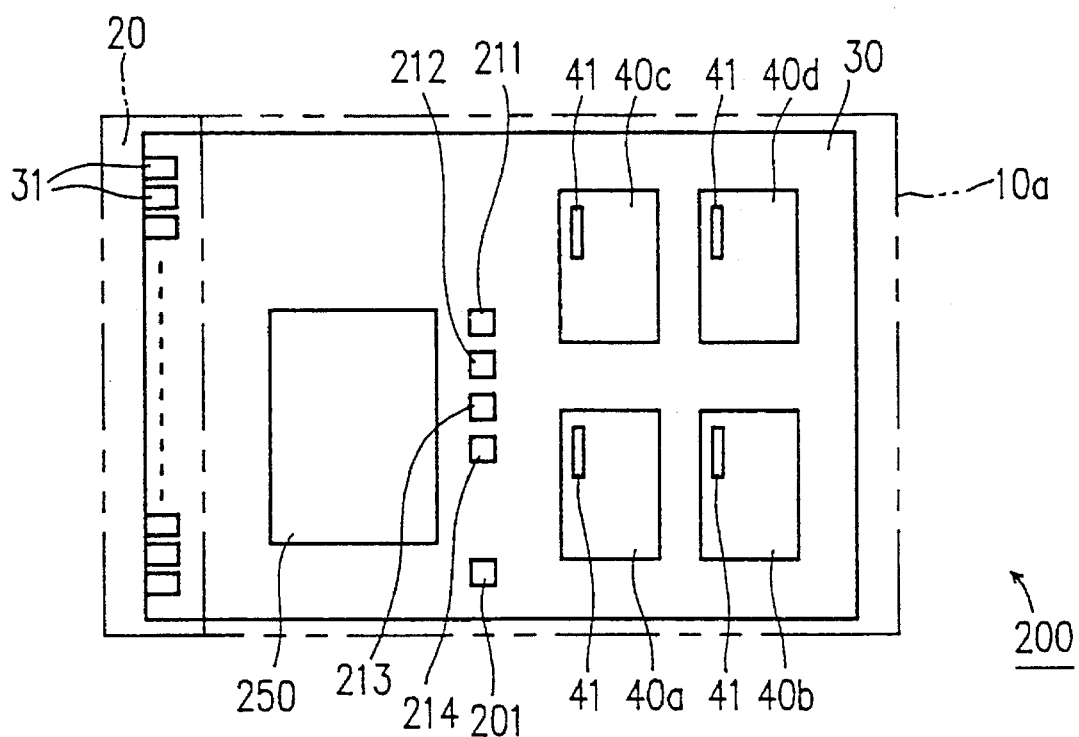
FIG. 12 is a plan view showing a configuration for a PC flash card as an IC card according to a third example of the present invention.

FIG. 12 is a plan view showing a configuration for an IC card 200 according to Example 3 of the present invention. Constituent elements which also appear in FIG. 1 (showing the IC card 100 of Example 1) are indicated by the same reference numerals as used therein.

The IC card 200 is a memory card or an I/O card pursuant to the JEIDA (Japan Electronics Industry Development Association) standard and PCMCIA (Personal Computer Memory Card International Association) standard, and is often referred to as a "PC card".

The IC card (hereinafter also referred to as the "PC card") 200 includes, as a signal processing device, a card interface 250 for processing a plurality of input signals and output signals, and as storage devices, a plurality of flash memories 40a to 40d mounted on a card substrate 30. Each of the flash memories 40a to 40d includes a status register 41 in which values of 16 registers corresponding to bit 0 to bit 15 vary depending on the operation state of the memory.

The arrangement of the registers of the status register 41 and the meanings of the registers are as described in Tables 1 and 2 above.

A signal input pad 201 is provided on the card substrate 30 of the PC card 200. The signal input pad 201 is employed for inputting a predetermined signal to the card interface 250 in a writing test or an erasing test. The position of the signal input pad 201 can be anywhere on the card substrate 30. In the configuration shown in FIG. 12, the signal input pad 201 is provided in the vicinity of the card interface 250.

In the vicinity of the signal input pad 201, control signal input pads 211 to 214 for inputting control signals for the flash memories 40a to 40d during the writing test or erasing test are provided.

As in the case Of the PC cards 100 of Examples 1 and 2, the signal input pad 201 and the control signal input pads 211 to 214 can be provided on a front or back face of the card substrate 30. Furthermore, it is applicable to provide some of the signal input pad 201 and the control signal input pads 211 to 214 on the front face, and others on the back face, of the card substrate 30. In general, the "front face" of an IC card is defined to be the face of the IC card on which a larger number of devices are provided. However, the "front face" may be defined as the other face of the IC card.

Figure 13:
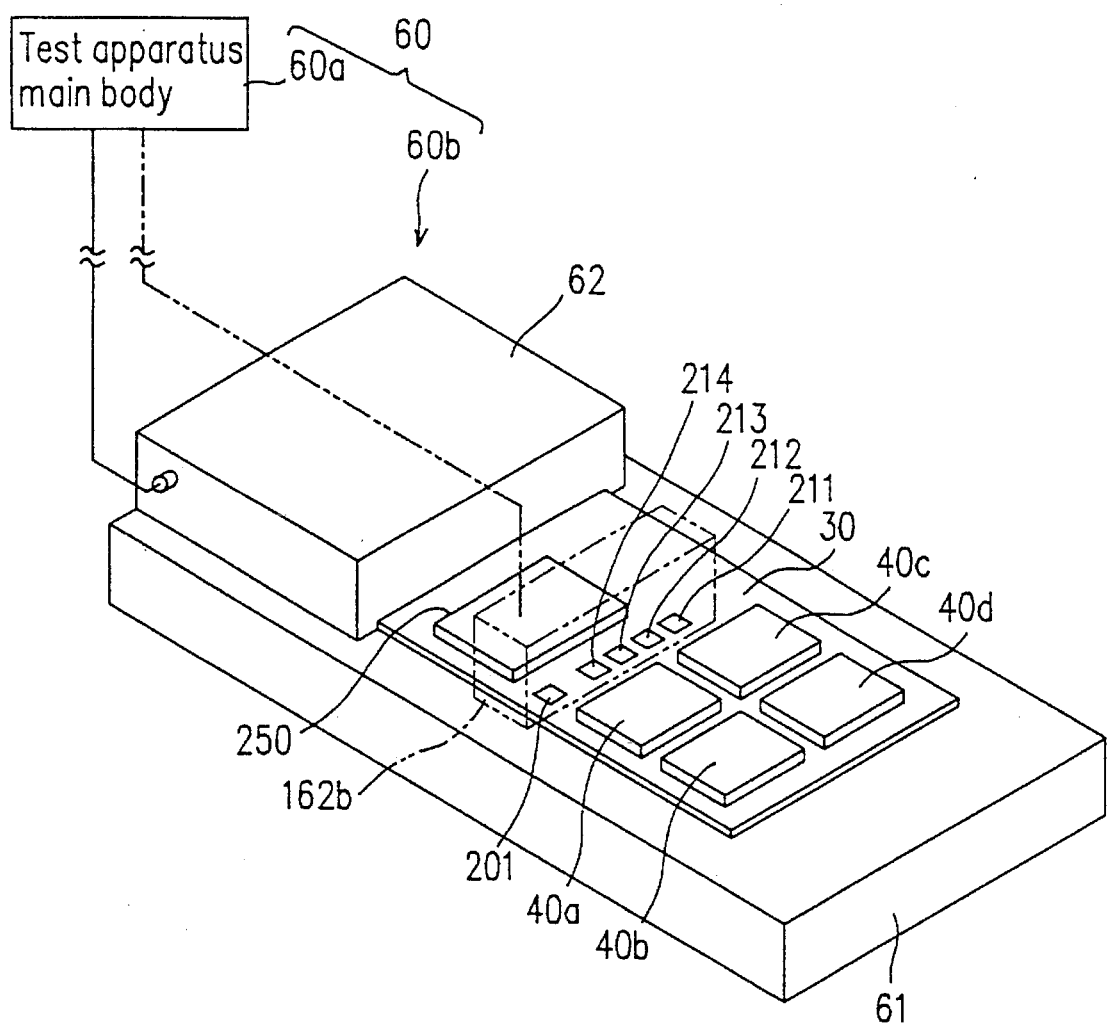
FIG. 13 is a schematic view showing a configuration for an apparatus for performing a writing test and an erasing test for flash memories incorporated in the PC card according to the third example before the packaging of the PC card.

FIG. 13 is a schematic view showing a configuration for an apparatus for performing a writing test and an erasing test before the packaging of the PC card 200. Constituent elements which also appear in FIG. 2 (showing the test apparatus 60 of Example 1) are indicated by the same reference numerals as used therein.

The test apparatus 60 includes a probe 162b for supplying the signal input pad 201 of the PC card 200 and the control signal input pads 211 to 214.

When the PC card 200 is connected to the test card connector 62, the probe 162b for applying a signal to the signal input pad 201 of the PC card 200 is connected to the signal input pad 201. The probe 162b is coupled to the test apparatus main body 60a. The signal input pad 201 may be provided on a back face of the card substrate 30. In this case, the probe 162b for applying a signal to the signal input pad 201 is provided inside the base 61. The electrical connection between the signal input pad 201, the control signal input pads 211 to 214, and the probe 162b can be achieved in the same manner as described in Example 1.

Figure 14:
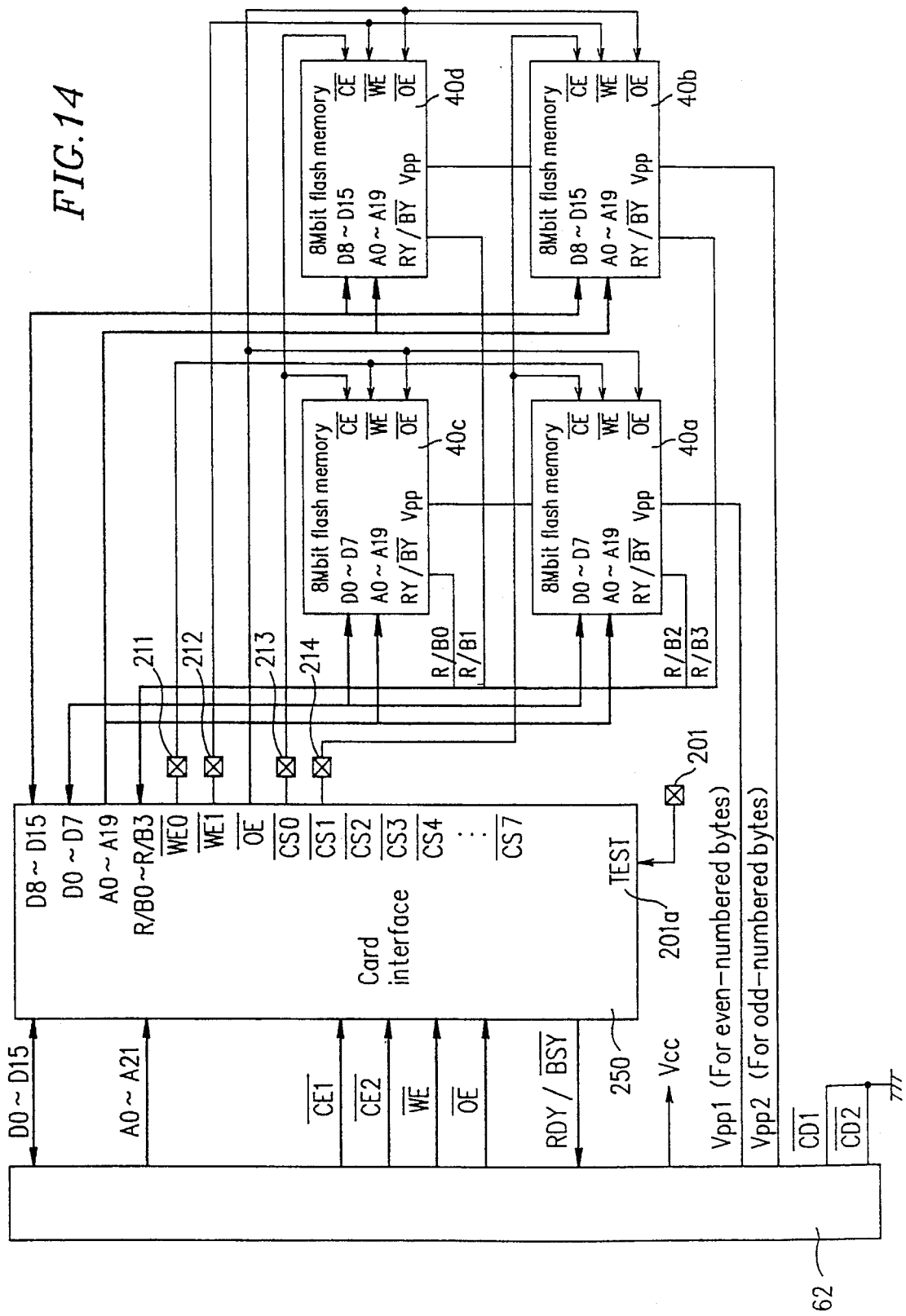
FIG. 14 is a diagram showing a flow of signals between a test card connector to be applied to the PC card according to the third example, a card interface of the PC card, and flash memories incorporated in the PC card.
Figure 15:
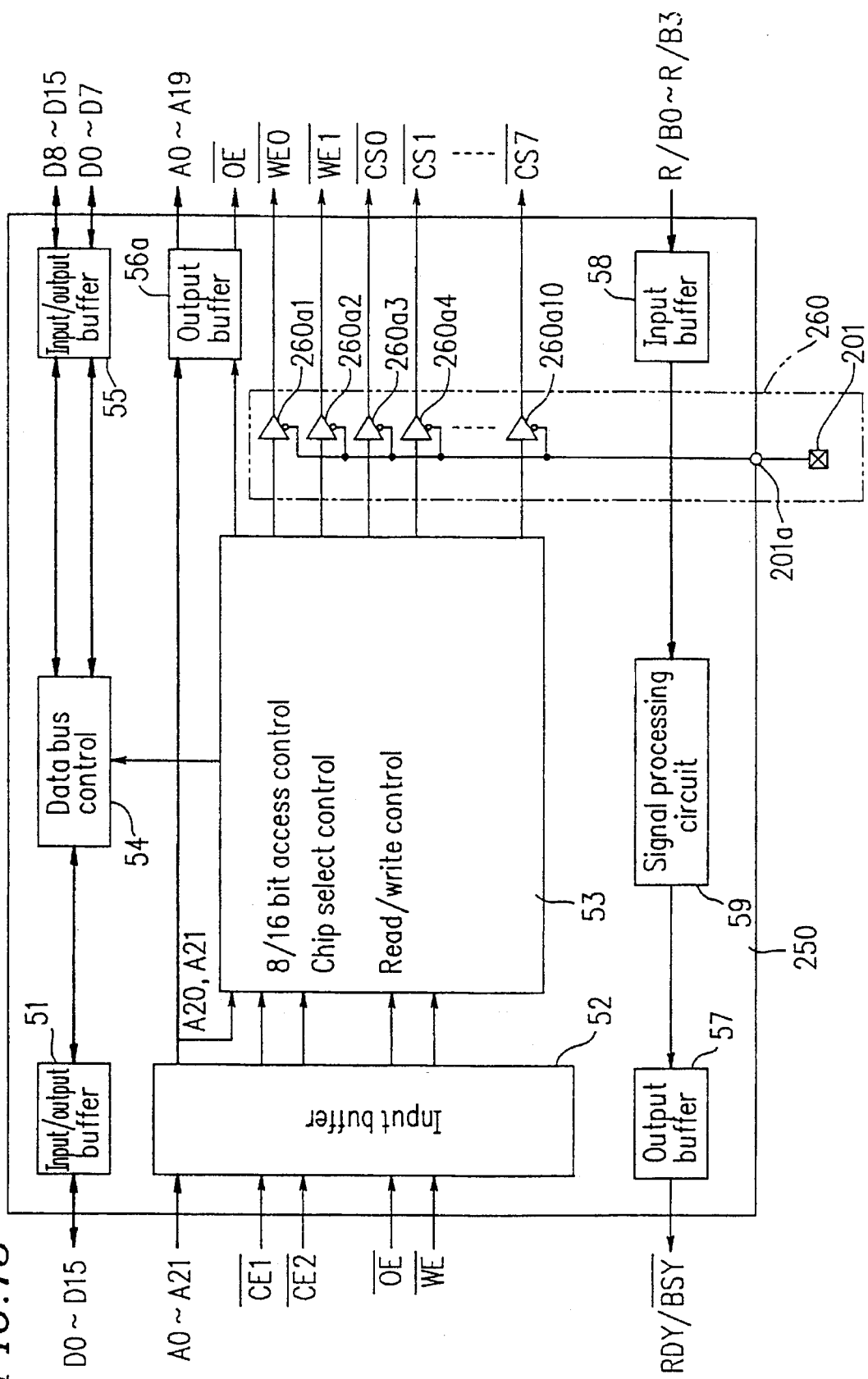
FIG. 15 is a block diagram showing a configuration for a card interface included in the PC card according to the third example.

FIG. 14 is a block diagram showing a flow of signals between the card interface 250 and the flash memories 40a to 40d. FIG. 15 is a detailed block diagram showing the internal configuration of the card interface 250.

The test circuit 260 includes a test terminal (TEST) 201a. The test circuit 260 can be so set as to become active when the level of the test terminal 201a is at the H level.

In the card interface 250, among output signals from a controller 53, chip enable signals /CE1 and /CE2, write enable signal /WE0 and /WE1 and chip select signals /CS0 to /CS7 are input to the test circuit 260. Signals corresponding to these input signals are output from the test circuit 260.

The test circuit 260 includes 3-state buffers 260a1 to 260a10. The 3-state buffers 260a1 to 260a10 receive the output signals /WE0 and /WE1 and /CS0 to /CS7 from the controller 53. Control inputs of the buffers 260a1 to 260a10 are coupled to the test terminal 201a.

In other words, when an H-level signal is input to the test terminal 201a, the test circuit 260 interrupts the output signals from the controller 53. As a result, the card interface 250 enters a test mode.

When an L-level signal is applied to the signal input pad 201a, the output signals form the controller 53 are output from the card interface 250. As a result, the card interface 250 enters a normal card operation mode.

The signal (signal TEST) applied to the signal input pad 201, the output signals from the controller 53, and the states of the flash memories 40a to 40d are shown in Table 5 below.

TABLE 5

| TEST | /WE0 | /WE1 | /CS0 to /CS7 | State of flash memory |
|---|---|---|---|---|
| H | | high-impedance state | | Desired device(s) is in a compulsory write enabled state |
| L | | Output of the control circuit = output of the card interface | | Depends on the signal from the connector |

As shown in Table 5, when the signal TEST is at the H level, the output terminals for the signals /WE0 and /WE1 and /CS0 to /CS7 output from the card interface 250 are in a high-impedance state. It is possible to select a desired one(s) of the flash memories to supply signals for the control signal input pad(s) corresponding to the desired one(s) of the flash memories.

The outputs of the 3-state buffers 260a1 to 260a4, which receive the signals /WE0 and /WE1 and /CS0 and /CS1, are coupled to the control signal input pads 211 to 214.

The chip select signals /CS2 to /CS7 are to be used when more flash memories are incorporated in the PC card 200 in the future for selecting the additional flash memories, and are not used in this example.

In accordance with the PC card 200 having the above-described configuration, all the flash memories 40a to 40d can be parallel written or parallel erased.

By applying an H-level signal to the input signal pad 201 when conducting a test, the output terminals /CS0, /CS1, /WE0, and /WE1 are in a high-impedance state. As a result, the signals /CS0, /CS1, /WE0, and /WE1 input from the card interface 250 are not input to the flash memories 40a to 40d. Accordingly, the signals /CS1, /CS2, /WE0, and /WE input from the test card connector 62 become null.

By inputting a L-level or H-level signal at the control signal input pads 211 to 214, an L-level signal is supplied to the terminals /CE and /WE of a desired one of the flash memories 40a to 40d. As a result, the desired one(s) of the flash memories 40a to 40d become accessible, thereby allowing a parallel write or parallel erase operation.

Accordingly, by applying an L-level signal to the control signal input pads 211 to 214, all the flash memories 40a to 40d on the card substrate 30 can be made accessible. By executing a predetermined test program in this state, e.g., the writing test by the byte access method illustrated in FIG. 7 or the erasing test by the byte access method illustrated in FIG. 9, it becomes possible to perform a parallel write operation or parallel erase operation by the byte access method for the flash memories 40a to 40d, as in Example 1.

Alternatively, by executing a predetermined test program in this state, e.g., the writing test by the word access method illustrated in FIG. 10 or the erasing test by the word access method illustrated in FIG. 11, it becomes possible to perform a parallel write operation or parallel erase operation by the word access method for the flash memories 40a to 40d, as in Example 2.

Furthermore, by applying an H-level signal to the signal input pad 201, the card interface 250 enters a test mode. According to the present example, it is possible to separately apply control signals to the control signal input pads 211 to 214 in a test mode state. In other words, desired one(s) of the flash memories 40a to 40d can be selected to so as to perform the writing test or erasing test for only those flash memories. Since the PC card 200 includes the control signal input pads 211 to 214, even larger liberty is provided for the parallel writing and parallel erasing for the flash memories.

Hereinafter, the process of a writing test or an erasing test for the flash memories 40c and 40d will be briefly described.

Figure 16:
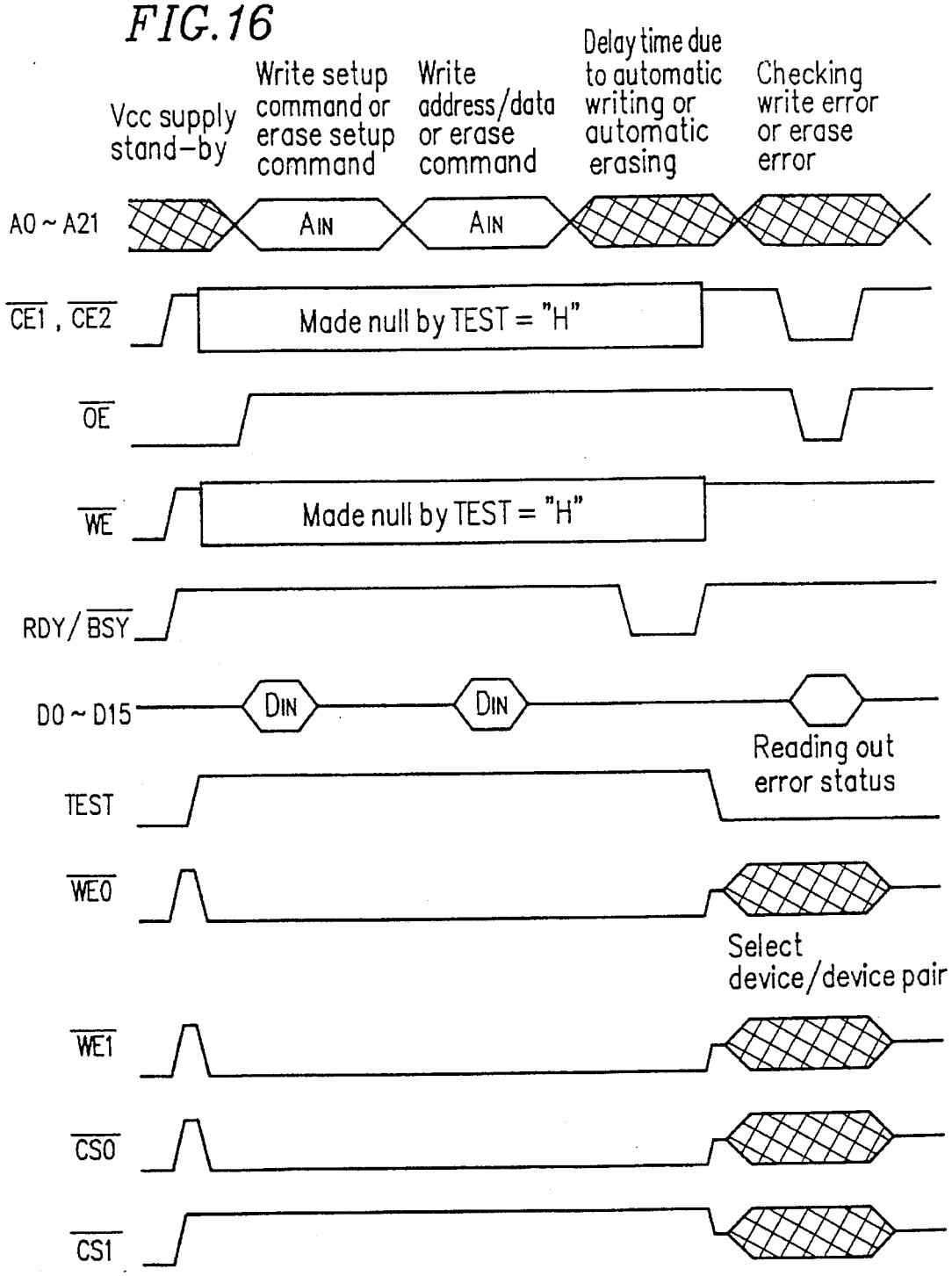
FIG. 16 is a timing diagram showing the change of various data signals, address signals, control signals, and the like in a writing test and an erasing test for the PC card according to the third example.
Figure 17:
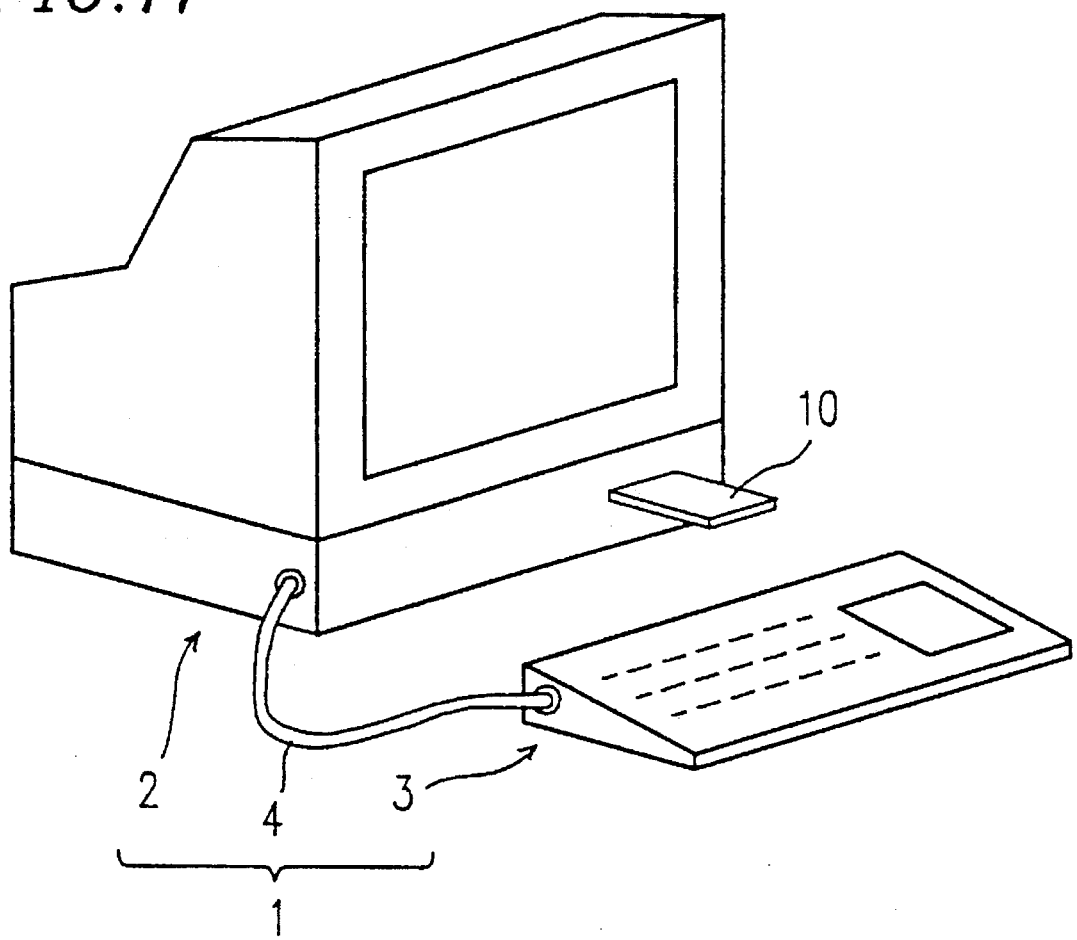
FIG. 17 is a view for describing a method for making access to information between a computer and a conventional IC card.

FIG. 16 is a timing diagram showing various signals to which access is made between the card interface 250, the signal input pad 201, the control signal input pads 211 to 214, and the flash memories 40a to 40d.

When an H-level signal is input to the signal input pad 201, the test terminal 201a of the test circuit 260 is placed at the H level. As a result, the output signals from the card interface 250 to the flash memories 40a to 40d are made null. If L-level signals are applied to the control signals input pads 211 to 213 and an H-level signal is input to the control signal input pad 214 in this state, the write enable signals /WE0 and /WE1 and the chip select signal /CS0 are set to the L level, and the chip select signal /CS1 is set to the H level. As a result, the flash memories 40c and 40d become accessible.

Thereafter, as described in Example 1, a writing test or an erasing test program is executed, so that the process described with reference to FIG. 7 or FIG. 9 is performed. Thus, the flash memories 40c and 40d can be parallel written or parallel erased during the writing or erasing test.

After finishing the test for the flash memories 40c and 40d, the chip select signal /CS0 is set to the H level, and the chip select signal /CS1 is set to the L level. As a result, the flash memories 40c and 40d become accessible. By executing a writing test or an erasing test program, all the flash memories 40a to 40d on the card substrate 30 can be parallel written or parallel erased during the writing or erasing test.

Thus, in accordance with the PC card 200 of the present invention, the card interface 250 for controlling access to and from external signals includes the test circuit 260 for applying signal voltages to a plurality of control signal output terminals for placing the flash memories 40a to 40d in a write enabled state, the output terminals being placed in a high-impedance state by an active signal. The PC card 200 includes a signal input pad for inputting the active signal to the test circuit 260 and control signal input pads 211 to 214 connected to at least one of the control signal output terminals. By applying the active signal to the signal input pad 201 from outside the PC card 200, the control signal output terminals enter a high-impedance state. Thus, the function of placing the flash memories into a write enabled state can be separated from the card interface 250.

As a result, by applying appropriate signals to the control signal input pads 211 to 214, a number of flash memories can be arbitrarily placed in a write enabled state regardless of the signals from a card connector. Accordingly, by executing a write command or erase command once for the flash memories in the write enabled state, the flash memories can be parallel written or parallel erased.

As a result, according to the present example, the time required for a writing test or an erasing test for a plurality of flash memories mounted on a substrate of an IC card can be reduced. Thus, the time required for the production test process for IC cards is effectively prevented from increasing as the high-density mounting technique for IC cards improves.

Furthermore, by applying an H-level signal to the signal input pad 201, the card interface 250 enters a test mode. According to the present example, it is possible to separately apply control signals to the control signal input pads 211 to 214 in a test mode state. In other words, desired one(s) of the flash memories 40a to 40d can be selected so as to perform the writing test or erasing test for only those flash memories. Thus, even larger liberty is provided for the parallel writing and parallel erasing for the flash memories.

The PC card 200 includes the signal input pad 201. By applying the active signal to the signal input pad 201 from outside the PC card 200, the flash memories 40a to 40d enter a write enabled state. Therefore, by executing a write command or erase command once for the flash memories in the write enabled state, the flash memories can be parallel written or parallel erased.

As a result, according to the present example, the time required for a writing test or an erasing test for a plurality of flash memories mounted on a substrate of an IC card can be reduced. Thus, the time required for the production test process for IC cards is effectively prevented from increasing as the high-density mounting technique for IC cards improves.

Moreover, only one signal input pad is required to be provided in the IC card, so that the various devices on the card substrate are hardly subject to any positional restraints.

As has been described, in accordance with an IC card of the present invention, a card interface for controlling access to and from external signals includes a test circuit for applying signal voltages to a plurality of control signal output terminals for placing the flash memories in a write enabled state, the output terminals being placed in a high-impedance state by an active signal, and the IC card includes a signal input pad for inputting the active signal to the test circuit and a control signal input pad connected to at least one of the control signal output terminals. By applying the active signal to the signal input pad from outside the IC card, the control signal output terminal(s) enters a high-impedance state. Thus, the function of placing the flash memories into a write enabled state can be separated from the card interface.

As a result, by applying appropriate signals to the control signal input pad, a number of flash memories can be arbitrarily placed in a write enabled state regardless of the signals from a card connector. Accordingly, by executing a write command or erase command once for the flash memories in the write enabled state, the flash memories can be parallel written or parallel erased.

As a result, according to the present example, the time required for a writing test or an erasing test for a plurality of flash memories mounted on a substrate of an IC card can be reduced. Thus, the time required for the production test process for IC cards is effectively prevented from increasing as the high-density mounting technique for IC cards improves.

The number of flash memories to be parallel written or erased can be adjusted by the signal(s) to be input to the control signal input pad(s). Therefore, a large amount of freedom is provided in the process of parallel writing and parallel erasing for flash memories.

In summary, the present invention provides the following advantage: some or all of a plurality of flash memory devices can be parallel written or parallel erased, thereby making it possible to write or to erase some or all of the flash memories, and consequently the time required to test the flash memories is more effectively reduced as the IC card incorporates a larger number of devices due to improvement in the high-density mounting technique, so that the problem of increase in the cost incurred by tests for flash memory devices can be substantially eliminated.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An IC card comprising a plurality of flash memories sharing data buses and address buses corresponding to addresses except for a decode address, and a card interface for receiving an external address signal, an external data signal, and an external control signal and for controlling access to and from the external signals, wherein the card interface comprises a test circuit for applying a signal potential to a plurality of control signal output terminals for placing the plurality of flash memories in a write enabled state, the signal potential being applied using an active signal, and wherein the IC card further comprises a signal input pad for inputting the active signal to the test circuit.

2. A method for parallel processing a plurality of flash memories included in an IC card having a card interface for receiving an external address signal, an external data signal, and an external control signal and for controlling access to and from the external signals, the plurality of flash memories sharing data buses and address buses corresponding to addresses except for a decode address, the card interface having a test circuit for applying a signal potential to a plurality of control signal output terminals for placing the plurality of flash memories in a write enabled state, the signal potential being applied using an active signal, and the IC card also having a signal input pad for inputting the active signal to the test circuit, the method comprising the steps of:
attaching the IC card to a card connector;
applying the active signal to the signal input pad so as to place all of the plurality of flash memories in the write enabled state, and
executing a write command or an erase command so as to supply a test signal to the plurality of flash memories via the card interface, thereby performing a parallel writing process or a parallel erasing process for all of the plurality of flash memories.

3. An IC card comprising a plurality of flash memories sharing data buses and address buses corresponding to addresses except for a decode address, and a card interface for receiving an external address signal, an external data signal, and an external control signal and for controlling access to and from the external signals, wherein the card interface comprises a test circuit for placing in a high-impedance state a plurality of control signal output terminals for placing the plurality of flash memories, the test circuit being placed in the high-impedance state by an active signal, and wherein the IC card further comprises a signal input pad for inputting the active signal to the test circuit and control signal input pads connected to the plurality of control signal output terminals.

4. A method for parallel processing a plurality of flash memories included in an IC card having a card interface for receiving an external address signal, an external data signal, and an external control signal and for controlling access to and from the external signals, the plurality of flash memories sharing data buses and address buses corresponding to addresses except for a decode address, the card interface having a test circuit for placing in a high-impedance state a plurality of control signal output terminals for placing the plurality of flash memories, the test circuit being placed in the high-impedance state by an active signal, and the IC card also having a signal input pad for inputting the active signal to the test circuit and control signal input pads connected to the plurality of control signal output terminals, the method comprising the steps of:
attaching the IC card to a card connector;
applying the external control signal to at least one of the control signal input pads while applying the active signal to the signal input pad so as to place those of the plurality of flash memories which correspond to the at least one control signal input pad in a write enabled state, and
thereafter executing a write command or an erase command so as to supply a test signal to the plurality of flash memories via the card interface, thereby performing a parallel writing process or a parallel erasing process for the flash memories which correspond to the at least one control signal input pad.

5. An IC card comprising:

a plurality of flash memories for storing data; and a card interface for receiving a control signal and an address signal comprising a first portion and a second portion and for supplying a write signal or an erase signal to the plurality of flash memories in accordance with the first portion of the address signal and the control signal, wherein the plurality of flash memories share a data bus for transmitting the data and an address bus for transmitting the second portion of the address signal;

the IC card further comprises a test circuit and a test terminal; and the test circuit sets a plurality of terminals of the card interface for outputting the write signal or the erase signal in a first state when the test terminal receives an active signal.

6. An IC card according to claim 5, wherein the first state is a high-impedance state.

7. An IC card according to claim 5, wherein the first state is a low-level state.

8. An IC card according to claim 5, wherein the second portion of the address signal represents an address of the at least two of the plurality of flash memories.

9. An IC card according to claim 6 further comprising a plurality of control signal input pads for receiving a write enable signal.

10. An IC card according to claim 9, wherein the plurality of control signal input pads are respectively connected to the plurality of terminals of the card interface.

11. A method for parallel processing a plurality of flash memories which store data, the plurality of flash memories being included in an IC card having a card interface for receiving a control signal and an address signal having a first portion and a second portion, and for supplying a write signal or an erase signal to the plurality of flash memories in accordance with the first portion of the address signal and the control signal, the plurality of flash memories sharing a data bus for transmitting the data and an address bus for transmitting the second portion of the address signal, and the IC card also having a test circuit and a test terminal, the method comprising the steps of:
supplying the active signal to the test terminal so as to place a plurality of output terminals for outputting the write signal or the erase signal in a first state;
supplying a write setup command signal or an erase setup command signal to the plurality of flash memories via the card interface; and
performing a parallel write process or a parallel erase process for the plurality of flash memories.

12. A method according to claim 11, wherein the first state is a low level state.

13. A method according to claim 11, wherein the parallel write process transmits data to be written in the plurality of flash memories and address information to be written in the plurality of flash memories, and the parallel erase process transmits an address of the plurality of flash memories to be erased.

14. A method for parallel processing a plurality of flash memories which store data, the plurality of flash memories being included in an IC card having a card interface for receiving a control signal and an address signal having a first portion and a second portion and for supplying a write signal or an erase signal to the plurality of flash memories in accordance with the first portion of the address signal and the control signal, the plurality of flash memories sharing a data bus for transmitting the data and an address bus for transmitting the second portion of the address signal, and the IC card also having a test circuit, an input pad for receiving an active signal, and a control signal input pad connected to a plurality of terminals for outputting the write signal and the erase signal, the method comprising the steps of:
supplying the active signal to the test terminal so as to place a plurality of output terminals for outputting the write signal or the erase signal in a high-impedance state;
supplying a second control signal to the control signal input pad so as to place at least one pair of the plurality of flash memories into a write enable state;
supplying a write setup command signal or an erase setup command signal to the at least one pair of the plurality of flash memories via the card interface; and
performing a parallel write process or a parallel erase process for the at least one pair of the plurality of flash memories.

15. A method according to claim 14, wherein the parallel write process transmits data to be written in the at least one pair of the plurality of flash memories and address information to be written in the at least one pair of the plurality of flash memories, and the parallel erase process transmits an address of the at least one pair of the plurality of flash memories to be erased.

* * * * *